(12) United States Patent
Afzalian

(10) Patent No.: US 10,896,974 B2
(45) Date of Patent: *Jan. 19, 2021

(54) METHOD OF FABRICATING SEMICONDUCTOR DEVICE

(71) Applicant: TAIWAN SEMICONDUCTOR MANUFACTURING CO., LTD., Hsinchu (TW)

(72) Inventor: Aryan Afzalian, Chastre (BE)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/685,197

(22) Filed: Nov. 15, 2019

(65) Prior Publication Data

US 2020/0091321 A1 Mar. 19, 2020

Related U.S. Application Data

(63) Continuation of application No. 15/655,974, filed on Jul. 21, 2017, now Pat. No. 10,483,380.

(Continued)

(51) Int. Cl.
*H01L 21/332* (2006.01)
*H01L 29/66* (2006.01)
(Continued)

(52) U.S. Cl.
CPC ........ *H01L 29/66977* (2013.01); *B82Y 10/00* (2013.01); *H01L 29/045* (2013.01); *H01L 29/0676* (2013.01); *H01L 29/083* (2013.01); *H01L 29/0834* (2013.01); *H01L 29/0847* (2013.01); *H01L 29/165* (2013.01); *H01L 29/205* (2013.01); *H01L 29/267* (2013.01); *H01L 29/42376* (2013.01); *H01L 29/66439* (2013.01); *H01L 29/66522* (2013.01); *H01L 29/66545* (2013.01); *H01L 29/66666* (2013.01); *H01L 29/66795* (2013.01); *H01L 29/7391* (2013.01); *H01L 29/068* (2013.01); *H01L 29/785* (2013.01); *H01L 29/78642* (2013.01)

(58) Field of Classification Search
CPC ...... H01L 29/45; H01L 29/847; H01L 29/205
USPC .......... 257/20, 192; 438/137, 138, 156, 212, 438/268
See application file for complete search history.

(56) References Cited

U.S. PATENT DOCUMENTS 6,303,479 B1   10/2001  Snyder
6,943,407 B2 *  9/2005  Ouyang .......... H01L 21/823807
                                                            257/329

(Continued)

*Primary Examiner* — Tan N Tran
(74) *Attorney, Agent, or Firm* — Birch, Stewart, Kolasch & Birch, LLP

(57) ABSTRACT

A method for fabricating a semiconductor device includes forming a channel region in a semiconductor substrate. The channel region is made of a first material. The method also includes forming source and drain regions in the semiconductor substrate. The method further includes forming a recess between the channel region and the drain region. The method further includes forming a tunnel barrier layer in the recess. The tunnel barrier layer is made of a second material, and a bandgap of the second material is greater than a bandgap of the first material. The method further includes forming a gate stack on the channel region.

20 Claims, 25 Drawing Sheets

Related U.S. Application Data

(60) Provisional application No. 62/487,509, filed on Apr. 20, 2017.

(51) Int. Cl.
| | | |
|---|---|---|
| *H01L 29/08* | (2006.01) | |
| *H01L 29/205* | (2006.01) | |
| *H01L 29/04* | (2006.01) | |
| *H01L 29/06* | (2006.01) | |
| *H01L 29/165* | (2006.01) | |
| *H01L 29/267* | (2006.01) | |
| *H01L 29/423* | (2006.01) | |
| *B82Y 10/00* | (2011.01) | |
| *H01L 29/739* | (2006.01) | |
| *H01L 29/78* | (2006.01) | |
| *H01L 29/786* | (2006.01) | |

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,583,614 B2 | 2/2017 | Grupp et al. |
| 9,608,116 B2 | 3/2017 | Ching et al. |
| 2017/0062599 A1 | 3/2017 | Feng et al. |

\* cited by examiner

200

METHOD OF FABRICATING SEMICONDUCTOR DEVICE

CROSS-REFERENCE TO RELATED APPLICATION

This application claims priority to U.S. Provisional Application Ser. No. 62/487,509, filed Apr. 20, 2017, which is herein incorporated by reference in its entirety. This application is a Continuation application of U.S. patent application Ser. No. 15/655,974, filed on Jul. 21, 2017, the entire of which is incorporated by reference herein.

BACKGROUND

Tunnel field-effect transistors (TFETs) are typically recognized as successors of metal-oxide semiconductor field-effect transistors (MOSFETs) because of their absence of short-channel effects and of their resulting low off-currents. Another advantage of TFETs is that the subthreshold swing can be less than 60 mV/dec, which is the physical limit of conventional MOSFETs, such that potentially lower supply voltages can be used. Different TFET integration approaches exist for both horizontal and vertical technologies.

At least part of the intrinsic channel region of the TFET device is situated between at least part of the highly doped source region and the gate structure. A disadvantage of this approach is the presence of an intrinsic channel between source and drain, so called p-i-n TFET. This region must be wide enough to act as a blocking layer for band-to-band tunnelling current which is not controlled by the gate, otherwise defined as leakage current. This region (tunnel region) creates a high on-current resistance and increases the device dimensions. TFETs having all tunnel paths turn on at the same time for fast switching and low operating voltage are in urgent need. In addition, high band-to-band tunnelling current in the on-state which means a small effective band gap is necessary at the tunnel junction.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
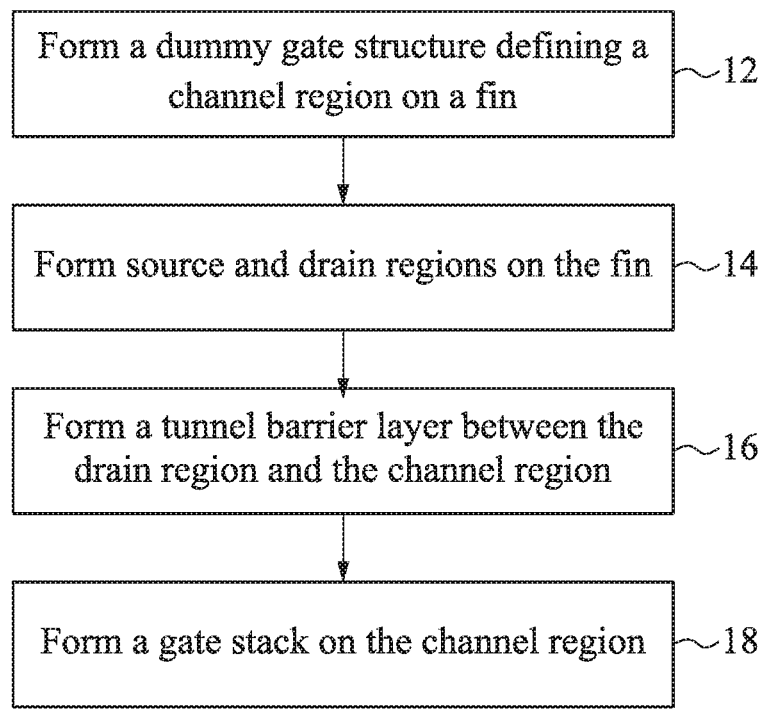
FIG. 1 is a flow chart illustrating a method of fabricating a semiconductor device in accordance with some embodiments of the instant disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Referring to FIG. 1, a flow chart of a method 10 of fabricating a semiconductor device in accordance with some embodiments of the instant disclosure. The method begins with operation 12 in which a dummy gate structure is formed on a fin to define a channel region. The method continues with operation 14 in which source and drain regions are formed on the fin. Subsequently, operation 16 is performed. A tunnel barrier layer is formed between the drain region and the channel region. The method continues with operation 18 in which a gate stack is formed on the channel region. The discussion that follows illustrates embodiments of semiconductor devices that can be fabricated according to the method 100 of FIG. 1.

Figure 2:
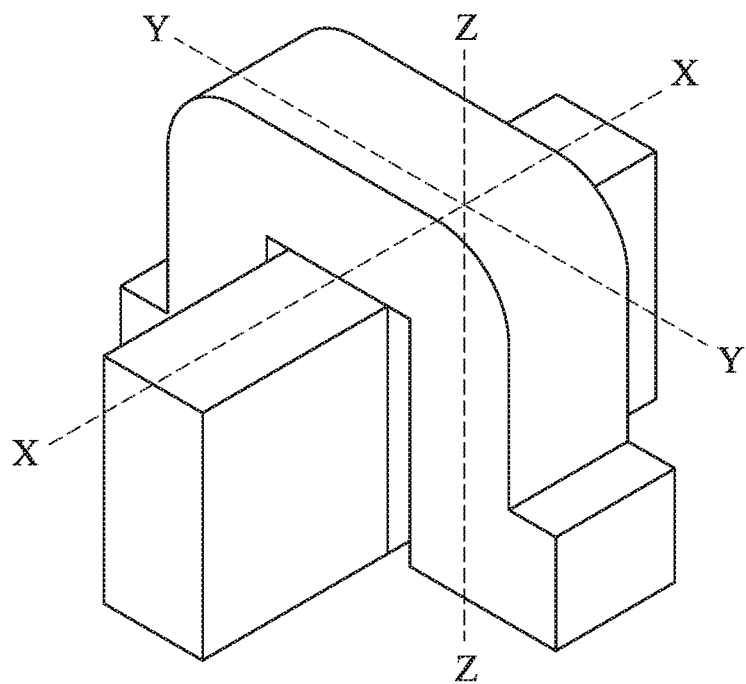
FIG. 2 is a perspective view of a semiconductor device in accordance with some embodiments of the instant disclosure.

Reference is now made to FIG. 2. A perspective view of an example FinTFET device 200 is illustrated. The FinTFET device 200 is a non-planar multi-gate transistor that is built on a semiconductor substrate. A thin silicon "fin-like" structure 230 (referred to as fin) forms the body of the FinTFET device 200. A gate of the FinTFET device 200 is wrapped around this fin 230. A source region 232 and a drain region 234 of the FinTFET device 200 are formed in extensions of the fin 230 on opposite sides of the gate 60. The fin 230 itself serves as a channel region 205.

FIGS. 3-13 are cross-sectional views of the FinFET device 200 taken at the X-Z plane.

Figure 3:
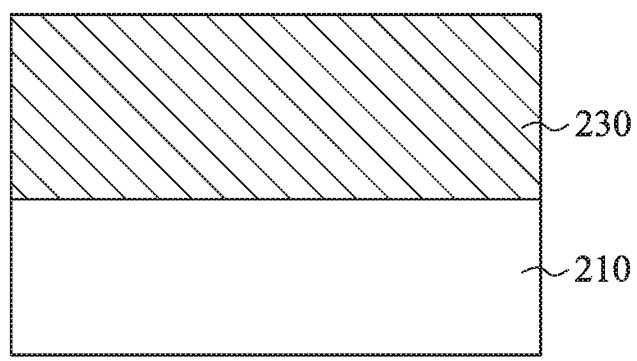
FIGS. 3-13 are cross-sectional views of a portion of a semiconductor device at various stages in a tunnel barrier formation process in accordance with some embodiments of the instant disclosure.

Reference is made to FIG. 3 and operation 12 in FIG. 1. The FinFET device 200 includes a substrate 210. In an embodiment, the substrate 210 includes a dielectric material, for example silicon oxide ($SiO_2$). A semiconductor layer is formed on the substrate 210. In an embodiment, the semiconductor layer includes a crystal silicon material. It is understood that the semiconductor layer may include other suitable materials in alternative embodiments. The semiconductor layer is patterned to form a fin structure 250. The fin structure 250 extends in an elongate manner along the X direction as shown in FIG. 2. The fin structure 250 will serve as a conductive channel for the FinFET device 200.

Figure 4:
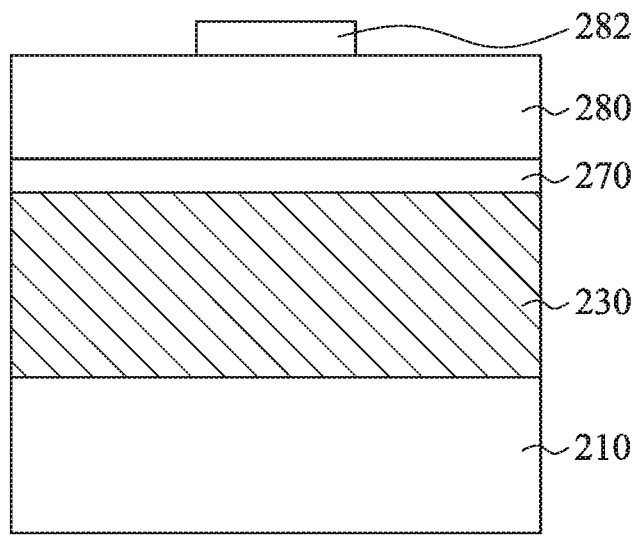

Reference is made to FIG. 4 and operation 12 in FIG. 1. A gate dielectric layer 270 is formed around the fin structure 250, and a dummy gate layer 280 is formed on the gate dielectric layer 270. The gate dielectric layer 270 and the dummy gate layer 280 may each be formed using a deposition process, for example chemical vapor deposition (CVD), physical vapor deposition (PVD), atomic layer deposition (ALD), combinations thereof, or another suitable process. In an embodiment, the gate dielectric layer 270 includes a material of for example, HfSiO, HfSiON, HfTaO, HfTiO, HfZrO, and $HfO_2Al_2O_3$ alloy. A hard mask layer 282 may be formed on the dummy gate layer 280 for the subsequent patterning process.

Figure 5:
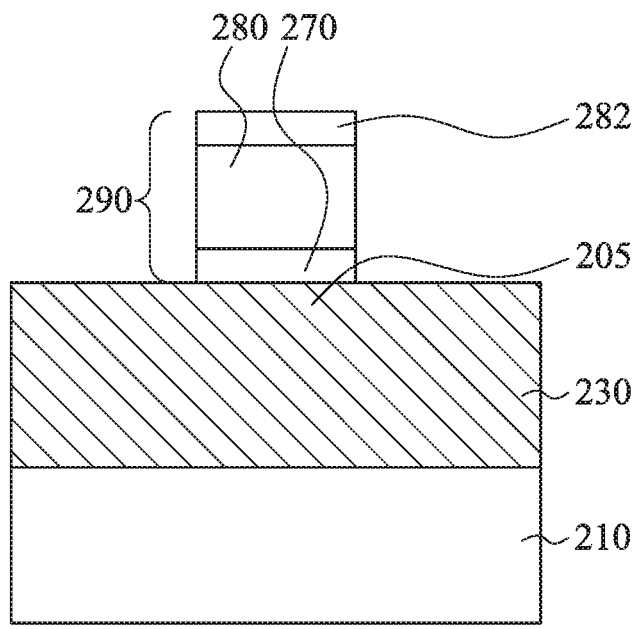

Reference is made to FIG. 5 and operation 12 in FIG. 1. The dummy gate layer 280 and the gate dielectric layer 270 undergo a patterning process to form a dummy gate structure 290. The dummy gate structure 290 extends in an elongate manner along the Y direction, as illustrated in FIG. 2. The dummy gate structure 290 wraps around a portion of the fin structure 230. The portion of the fin structure 230 being wrapped around by the dummy gate structure 290 constitutes a conductive channel region 205 according to an embodiment.

Figure 6:
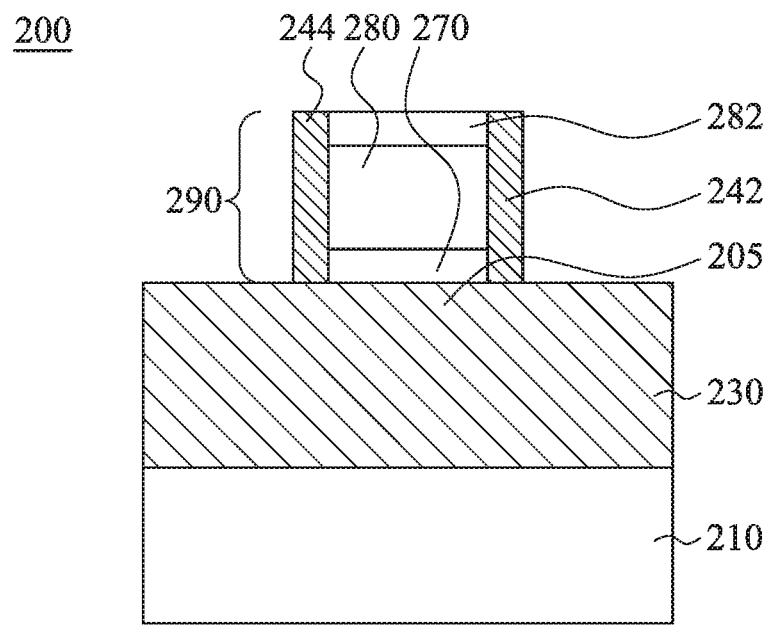

Reference is made to FIG. 6 and operation 12 in FIG. 1. Gate spacers 242 and 244 are formed around the long sides of dummy gate structure 290. In other words, the spacers 242 and 244 extend in an elongate manner along the Y direction. The gate spacers 242 and 244 are formed by depositing a spacer material over the dummy gate structure 290 and thereafter performing a patterning process (for example an etching process) on the spacer material. The spacer material may include a dielectric material. In an embodiment, the spacer material includes silicon oxide or silicon nitride.

Figure 7:
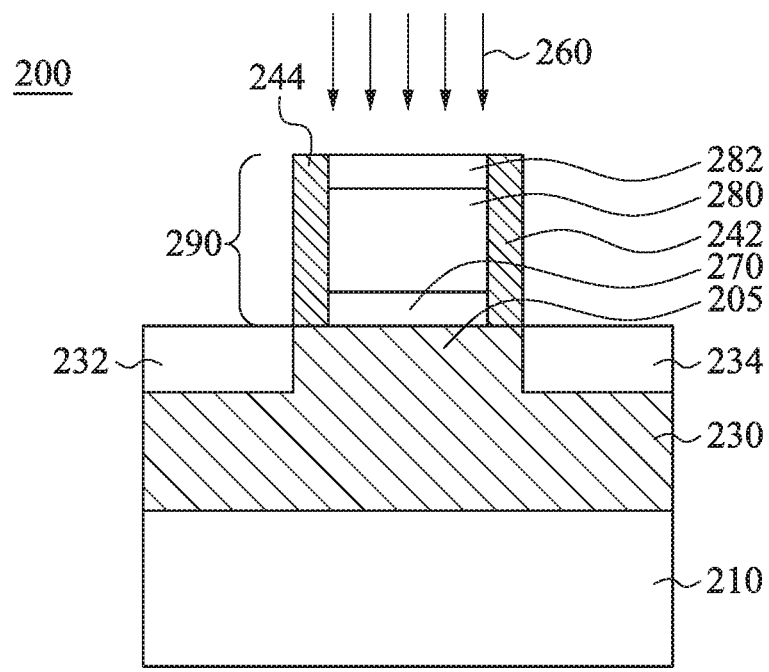

Reference is made to FIG. 7 and operation 14 in FIG. 1. After the spacers 242 and 244 are formed, the source region 232 and drain region 234 are epitaxially formed in the fin 230. Examples of source region 232 and drain region 234 materials include, but are not limited to, group IV materials such as Si, Ge, C and binary compounds thereof, or Group III-V materials such as In, Ga, As, Sb, Al, P, B, N and binary, tertiary and quaternary compounds. The source region 232 and drain region 234 may have different materials. The source region 232 of the fin 230 has a p-type dopant in case of an n-type TFET, or alternatively in case of a p-type TFET the source region 232 is n doped. The drain region 234 of the fin 230 has an n-type dopant in case of an n-type TFET, or alternatively in case of a p-type TFET the drain region 234 is highly p doped. The channel region 205 is situated in between the source region 232 and drain region 234. The dopant concentration of the channel region 205 is intrinsic or close to the range of undoped.

Figure 8:
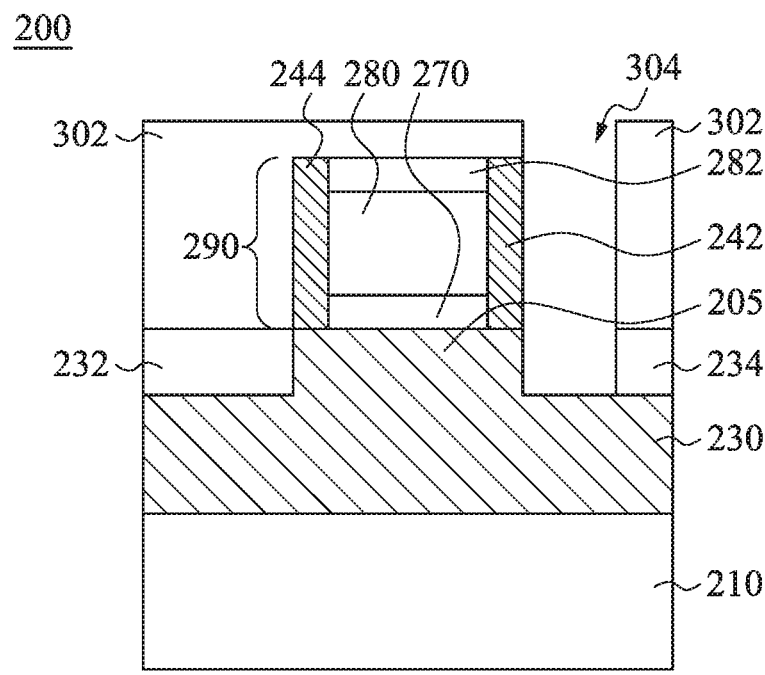

Reference is made to FIG. 8 and operation 16 in FIG. 1. A mask layer 302 is formed on the semiconductor substrate 210. The mask layer 302 covers up the fin 230 and the dummy gate structure 290. After patterning, a portion of the drain region 234 is exposed from an opening 304 of the mask layer 302. This exposed portion is situated between the channel region 205 and the drain region 234 on the fin 230. The position of the opening 304 and the width of the opening 304 may be adjusted for maximizing off-current reduction of the FinTFET device 200. An etching process is performed to remove the exposed drain region 234. A recess is formed in the fin 230 between the channel region 205 and the remaining drain region 234.

Figure 9:
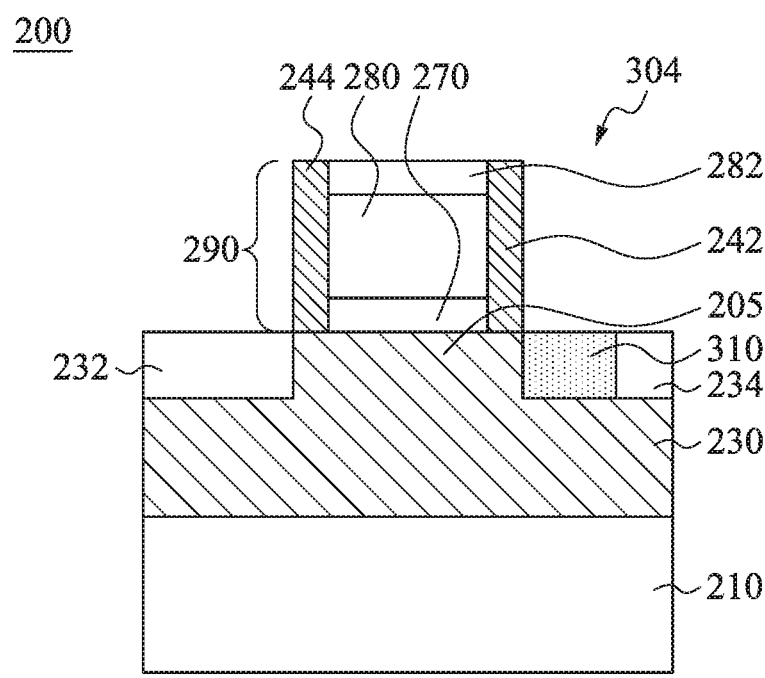

Reference is made to FIG. 9 and operation 16 in FIG. 1. An epitaxial process is performed to form the tunnel barrier layer 310. Examples of tunnel barrier material include, but are not limited to, group IV materials such as Si, Ge, C and binary compounds thereof, or Group III-V materials such as In, Ga, As, Sb, Al, P, B, N and binary, tertiary and quaternary compounds. The material of the tunnel barrier layer 310 has a larger bandgap than the channel region 205. For example, if the channel region 205 has a material of InAs, the tunnel barrier layer 310 has a material of Indium Gallium Arsenide (InGaAs). In some embodiments, the channel region 205 is made of a material including InAs, and the drain region 234 the same. The channel region 205 is intrinsic, while the drain region 234 may be doped with n-type or p-type dopant. The tunnel barrier layer 310 is epitaxially formed. The tunnel barrier layer 310 may be in the configuration of $In_xGa_{1-x}As$, win which x is a number smaller than 1. By adjusting x, the tunnel barrier height of the tunnel barrier layer 310 can be finely tuned to a suitable on/off current. In addition, the tunnel barrier width of the tunnel barrier layer 310 can be finely tuned by adjusting x. In some embodiments, x is a number close to 0.9, either slightly larger or smaller (x≈0.9). For example, x may be 0.85, and the tunnel barrier layer 310 has a configuration of $In_{0.85}Ga_{0.15}As$. In still another example, x may be 0.92, and the tunnel barrier layer 310 has a configuration of $In_{0.92}Ga_{0.08}As$. The tunnel barrier layer 310 is an indium rich layer.

Figure 10:
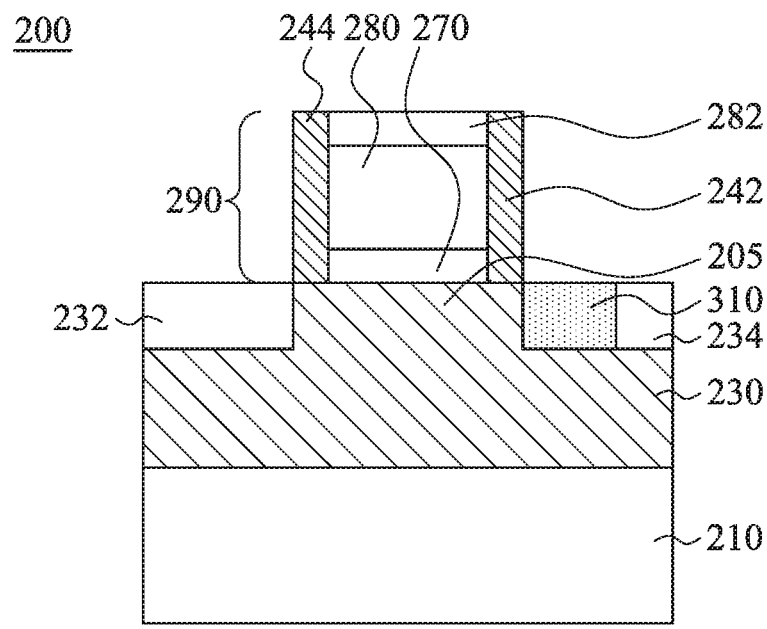
Figure 43:
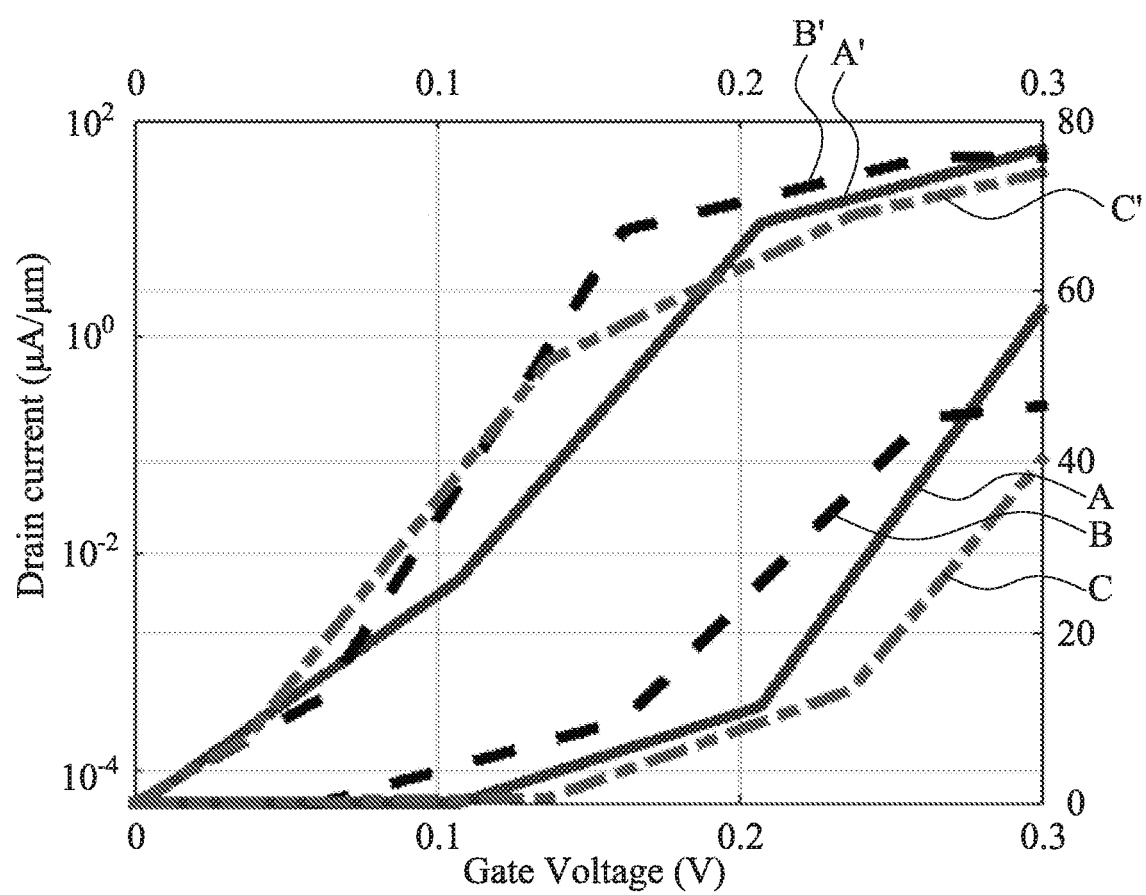
FIG. 43 is a graph showing on/off current in an nTFET device.

Reference is made to FIG. 10. The tunnel barrier layer 310 is a layer with a valence (p-TFET) or conduction (n-TFET) band offset and has a different having larger bandgap than the channel region 205 so as to create a tunnel barrier with respect to the channel region 205 and drain region 234 in the valence or conduction band respectively. TFETs typically suffer from low on-currents, a drawback related to the large resistance of the tunnel barrier. A TFET is in fact a p-i-n diode, which is reverse biased and gated. When a sufficiently large reverse bias is applied, quantum mechanical tunnelling occurs of electrons from the valence band (in the p-doped section) to the conduction band (in the n-doped section), an effect usually called Zener breakdown. A tunnel barrier has to be crossed in the process. In a TFET, this tunnel effect is desired and represents the on-state of the transistor. The amount of current in the on-state is determined by the tunnel barrier width. The barrier width is the smallest when there is a highly doped region at either side of the tunnel barrier. By adding the tunnel barrier layer 310 at the drain region 234 of the TFET, an additional confinement in the transport direction is created, which in turns results in quasi-bound states. That is a resonant tunnelling (RT) state of the TFET. Sharper density of state (DoS) in the channel region 205 and sharper transmission peaks can be obtained. This can suppress the unwanted ambipolar BTBT conduction in the off-state and reduce the leakage floor level. Attention is now invited to FIG. 43. In FIG. 43 drain current (µA/µm) is plotted against gate voltage (V) in standard scale and in log scale. Lines A, B, and C refer to InAs channel region, InGaAs tunnel barrier, and InGaAs channel region in standard scale respectively. Lines A', B', and C' refer to InAs channel region, InGaAs tunnel barrier, and InGaAs channel region in log scale respectively. It can be seen on the graph that line B' (InGaAs tunnel barrier layer) has a much steeper slope between the on and off states. Due to larger III-V element mass and bandgap, the addition of tunnel barrier layer is effective in source-to-drain tunnelling (SDT) reduction that appears in scaled TFET (e.g typically for gate length below 25 nm in III-V TFETs). This typically helps to reduce leakage and improve subthreshold swing (SS).

Figure 11:
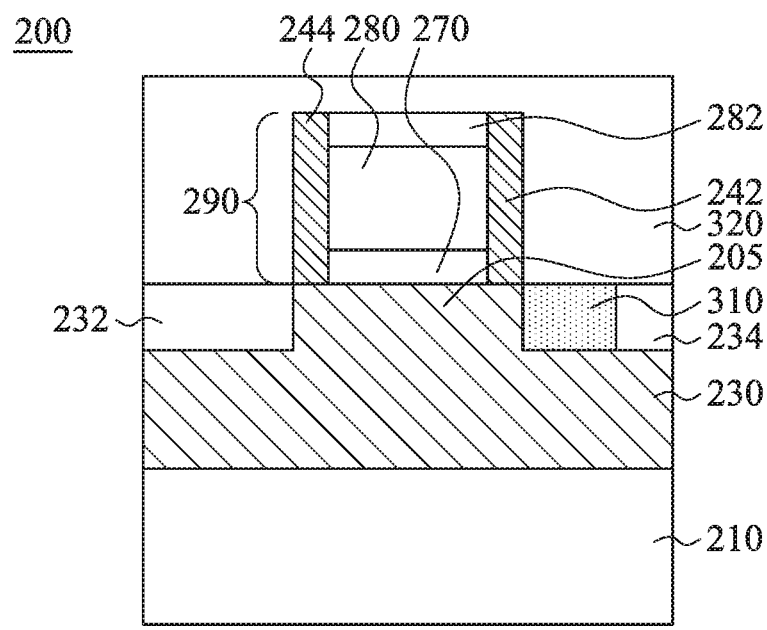

Reference is made to FIG. 11 and operation 18 in FIG. 1. An interlayer dielectric layer 320 is deposited on the semiconductor substrate 210 on the dummy gate structure 290 and the fin 230, which includes the source region 232 and the drain region 234 and the tunnel barrier layer 310.

Figure 12:
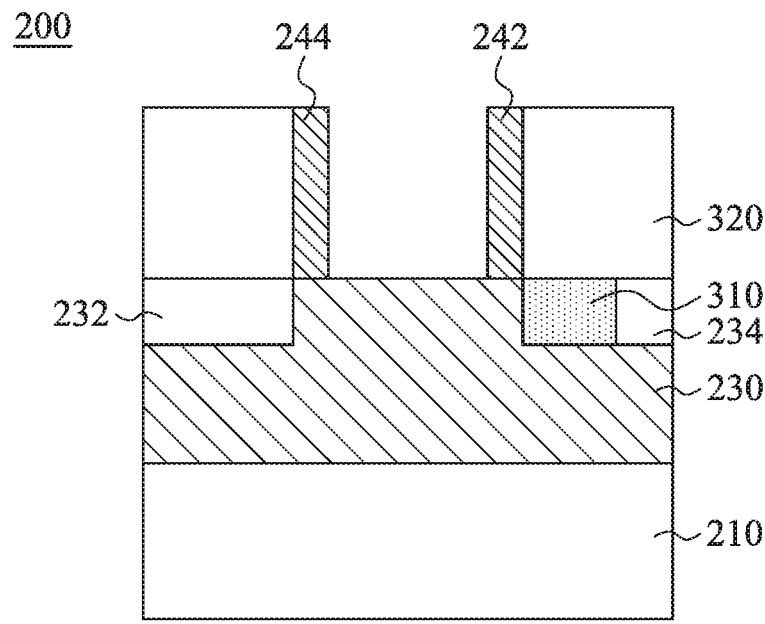

Reference is made to FIG. 12 and operation 18 in FIG. 1. The interlayer dielectric layer 320 is thinned down to expose the dummy gate structure 290, and the dummy gate structure 290 including the dummy gate layer 280 and the gate dielectric layer 270 is removed. A space is left after the removal of the dummy gate structure 290, and the gate spacers 242 and 244 remain on the fin 230.

Figure 13:
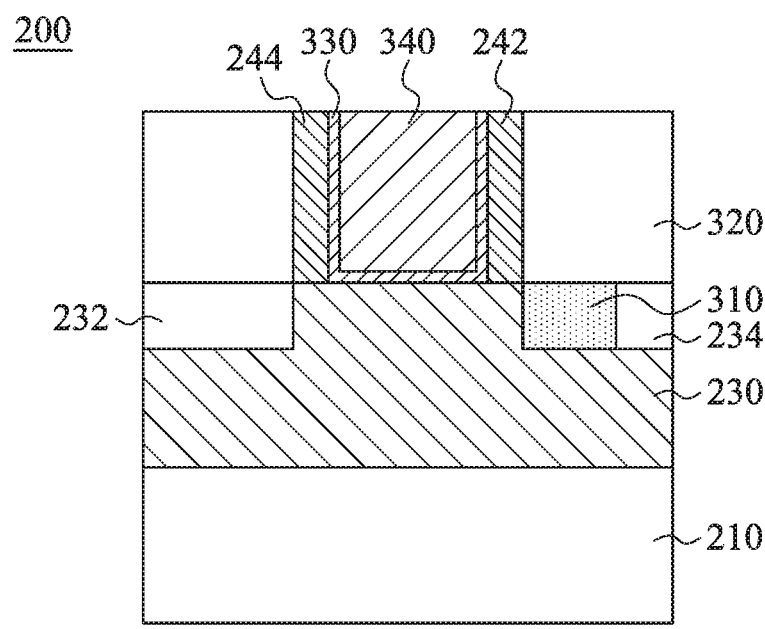

Reference is made to FIG. 13 and operation 18 in FIG. 1. A gate stack including high-k dielectric layer 330 and a gate electrode 340 is formed in the space left by the dummy gate structure 290. The high-k dielectric layer 330 conforms to the space left by the dummy gate structure 290 and therefore a thin layer in a shape of U covers up the sidewalls of the gate spacers 242 and 244. The high-k dielectric layer 330 may have more than one layer. In some embodiments, the high-k dielectric layer 330 may be a thin layer covers the top surface of the channel region 205. A work function metal layer (not shown) may be formed between the high-k dielectric layer 330 and the gate electrode 340 so as to achieve a desirable electrical property. The gate electrode 340 fills in the remaining space with the high-k dielectric layer underlying, and the gate stack is complete. In an embodiment, the tunnel barrier layer 310 is not covered by the gate stack. In some embodiment, the tunnel barrier layer may be partially covered by the gate stack or completely covered by the gate stack.

Figure 14:
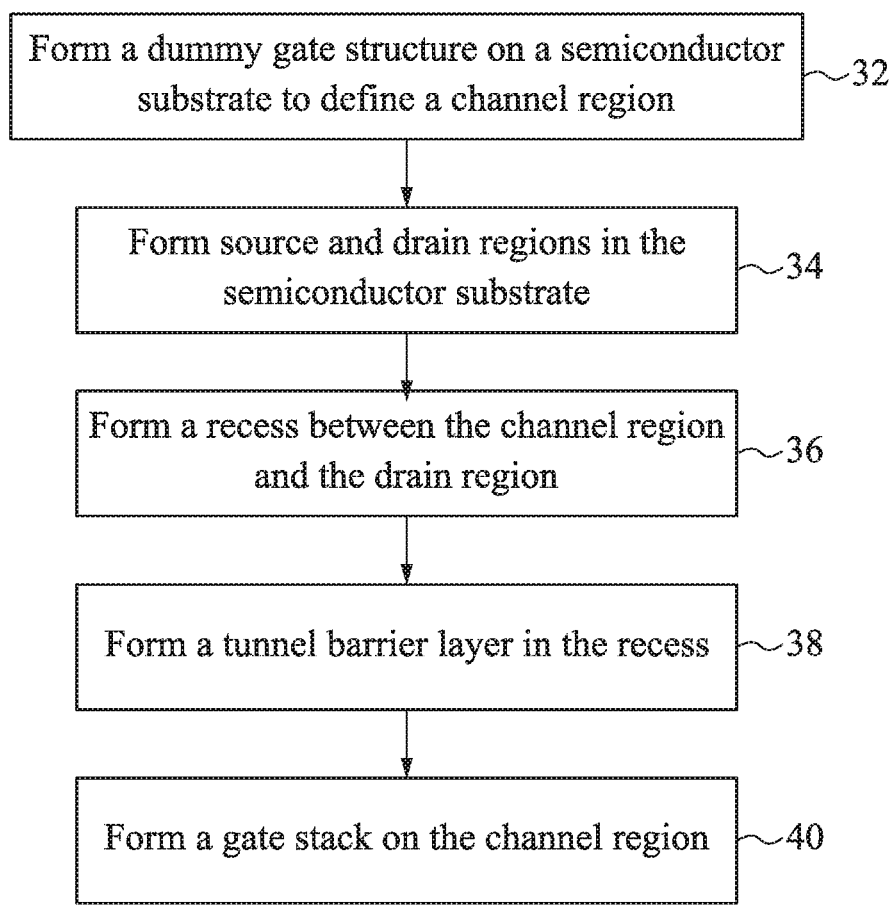
FIG. 14 is a flow chart illustrating a method of fabricating a semiconductor device in accordance with some embodiments of the instant disclosure.

Referring to FIG. 14, a flow chart of a method 30 of fabricating a semiconductor device in accordance with some embodiments of the instant disclosure. The method begins with operation 32 in which a dummy gate structure is formed on a semiconductor substrate to define a channel region. The method continues with operation 34 in which source and drain regions are formed in the semiconductor substrate. Subsequently, operation 36 is performed. The semiconductor substrate is patterned to define a tunnel barrier region between the channel region and the drain region. The method continues with operation 38 in which a tunnel barrier layer is formed in the tunnel barrier region. The method continues with operation 40 in which a gate stack is formed on the channel region. The discussion that follows illustrates embodiments of semiconductor devices that can be fabricated according to the method 30 of FIG. 14.

Figure 15:
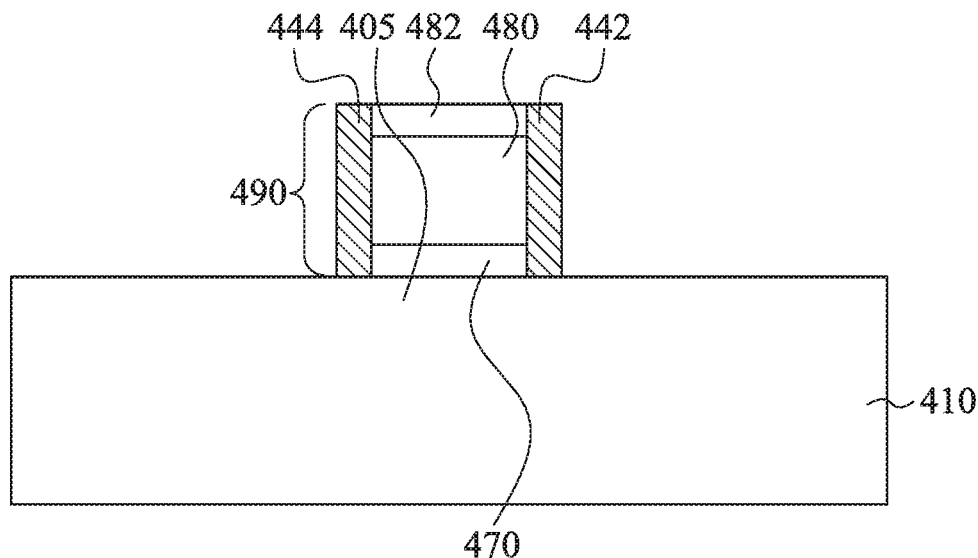
FIGS. 15-21 are cross-sectional views of a portion of a semiconductor device at various stages in a tunnel barrier formation process in accordance with some embodiments of the instant disclosure.

Reference is made to FIG. 15 and operation 32 in FIG. 14. The TFET device 400 includes a semiconductor substrate 410. A gate dielectric layer 470 and a dummy gate layer 480 are formed on the semiconductor substrate 410. By a patterning process employing a hard mask layer 482 that is disposed on the dummy gate layer 480, a dummy gate structure 490 is formed. The portion of the semiconductor substrate being covered by the dummy gate structure 490 constitutes a conductive channel region 405 according to an embodiment.

Reference is still made to FIG. 15. Gate spacers 442 and 444 are formed around the long sides of dummy gate structure 490. The gate spacers 442 and 444 are formed by depositing a spacer material over the dummy gate structure 490 and thereafter performing a patterning process (for example an etching process) on the spacer material. The spacer material may include a dielectric material. In an embodiment, the spacer material includes silicon oxide or silicon nitride.

Figure 16:
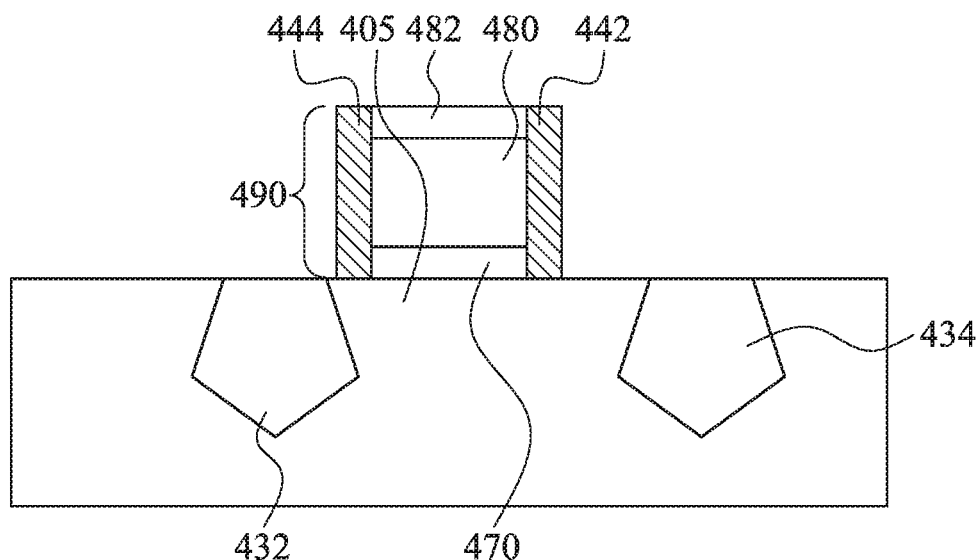

Reference is made to FIG. 16 and operation 34 in FIG. 14. Source region 432 and drain region 434 are formed in the semiconductor substrate 410. The source region 432 and the drain region 434 are formed by epitaxial growth. In some embodiments, the epitaxial growth process involves forming recesses in the semiconductor substrate 410. This removal may be performed by a reactive ion etch (RIE). Subsequently, the source region 432 and drain region 434 are epitaxially grown by, for example, a low pressure chemical vapour deposition (LPCVD) process. The source region 432 and the drain region 434 are then doped with n-type or p-type dopant respectively.

Reference is still made to FIG. 16. In some embodiments, the dummy gate structure 490 and gate spacers 442 and 444 are used as hard masks for the etching. In this case, the source region 432 and the drain region 434 are positioned in substantially symmetry with respect to the dummy gate structure 490. In some embodiments, the source region 432 and the drain region 434 are not positioned in symmetry with respect to the dummy gate structure 490 as shown in FIG. 16. The drain region 434 is further apart from the gate spacer 442, leaving a gap between the channel region 405 and the drain region 434. That is, the drain region 434 is spaced apart from the gate spacer 442. The gap between the channel region 405 and drain region 434 is left for the insertion of the tunnel barrier layer therebetween, which will be formed in a later stage. The source region 432 remains close to the gate spacer 444 and immediately adjacent to the channel region 405.

Figure 17:
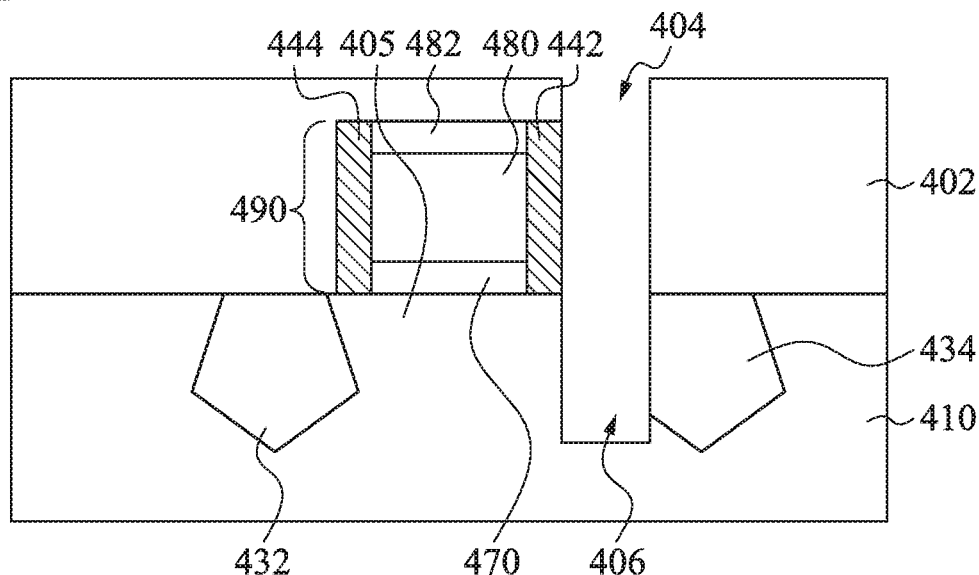

Reference is made to FIG. 17 and operation 36 in FIG. 14. A mask layer 402 is deposited on the semiconductor substrate 410 and covers up the source region 432, drain region 434 and the dummy gate structure 490. The mask layer 402 is then patterned to form an opening 404. The position of the opening 404 corresponds to the gap between the channel region 405 and the drain region 434. The opening 404 reflects the position of where the tunnel barrier layer will be formed.

Reference is still made to FIG. 17. Next, a portion of the semiconductor substrate 430 is removed by, for example, etching. The depth of the recess 406 should at least be substantially equal to the depth of the drain region 434. The recess 406 is situated between the channel region 405 and the drain region 434, reflecting where the gap used to be. In some embodiments, the recess 406 slightly overlaps the drain region 434 and therefore hollows out a portion of the drain region 434 as shown in FIG. 17. In some embodiments, the recess 406 may have a smaller dimension and be slightly offset from the drain region 434, therefore leaving the drain region 434 relatively intact or slightly brushing the edge of the drain region 434.

Figure 18:
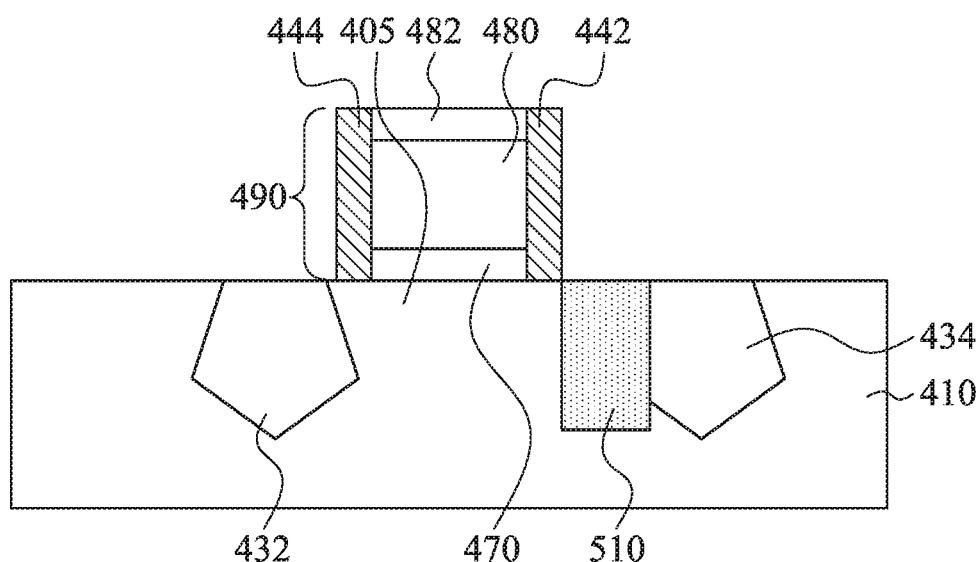

Reference is made to FIG. 18 and operation 38 in FIG. 14. The tunnel barrier layer 510 is formed in the recess 406. The tunnel barrier layer 510 is formed by filling a tunnel barrier material in the recess 406. The tunnel barrier material has similar property as previously described. The tunnel barrier material may be formed with material having larger bandgap than the channel region 405. Because of the position of the recess 406, the tunnel barrier layer 510 does not overlap with the gate spacer 442 or the dummy gate structure 490. As shown in FIG. 18, the tunnel barrier layer 510 stars from where the gate spacer 442 ends. In some embodiments, if the recess 406 is shifted slightly towards the gate spacer 442, the tunnel barrier layer 510 may be partially overlaps with the gate spacer 442. That is, a portion of the tunnel barrier layer 510 is under the coverage of the gate spacer 442, while the remaining portion of the tunnel barrier layer 510 is free from the coverage of the gate spacer 442. The tunnel barrier layer 510 is inserted between the channel region 405 and the drain region 434 for off-current reduction.

Figure 19:
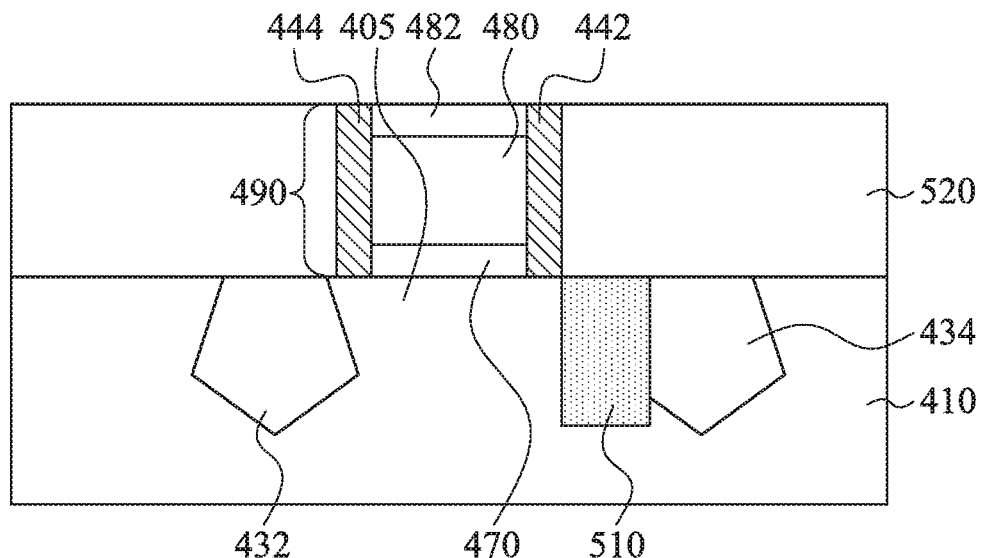

Reference is made to FIG. 19 and operation 40 in FIG. 14. An interlayer dielectric layer 520 is deposited on the semiconductor substrate 410 on the dummy gate structure 490, which includes the source region 432 and the drain region 434 and the tunnel barrier layer 510.

Figure 20:
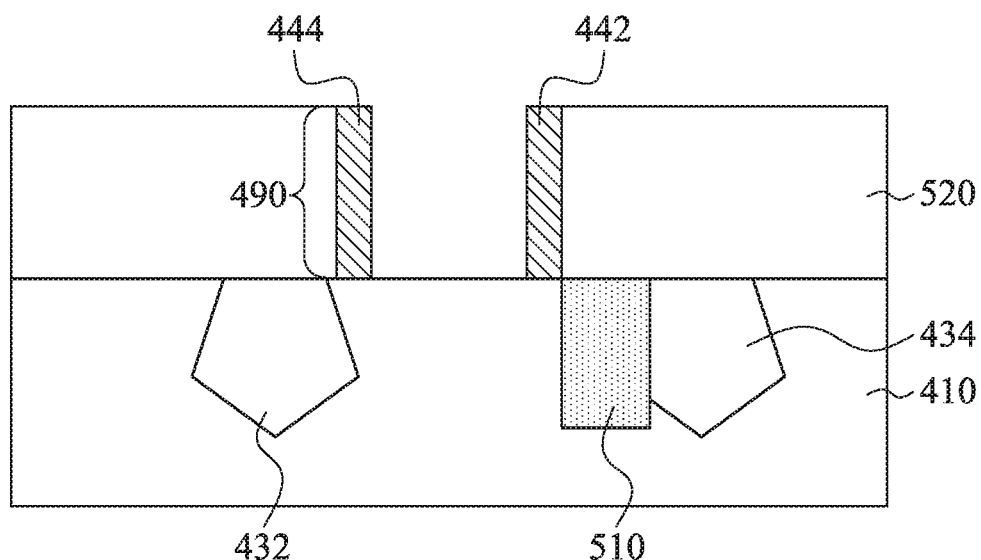

Reference is made to FIG. 20 and operation 40 in FIG. 14. The interlayer dielectric layer 520 is thinned down to expose the dummy gate structure 490, and the dummy gate structure 490 including the dummy gate layer 480 and the gate dielectric layer 470 is removed. A space is left after the removal of the dummy gate structure 490, and the gate spacers 442 and 444 remain on the semiconductor substrate 410.

Figure 21:
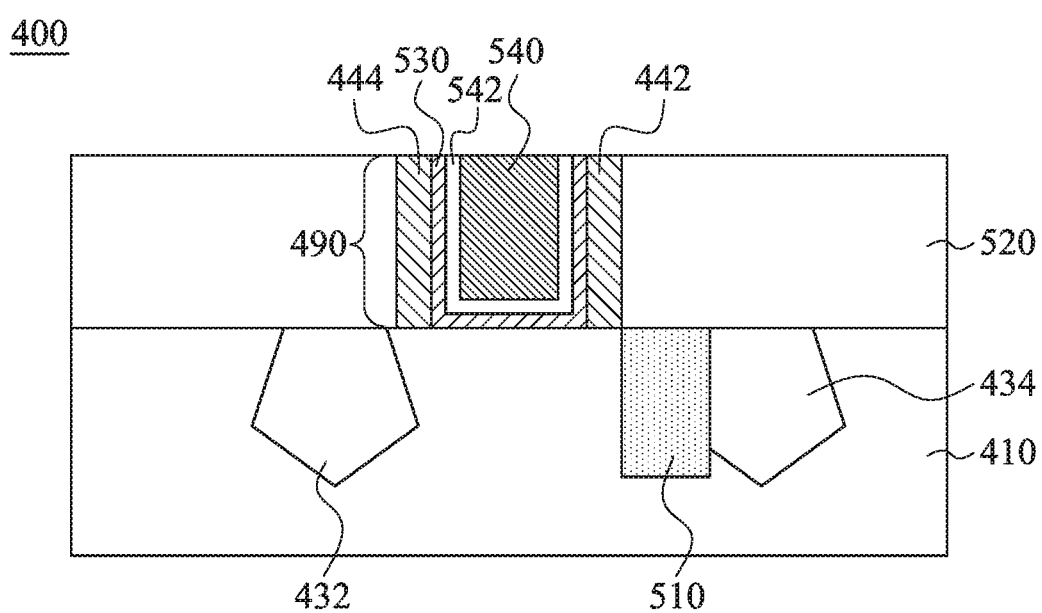

Reference is made to FIG. 21 and operation 40 in FIG. 14. A gate stack including high-k dielectric layer 530 and a gate electrode 540 is formed in the space left by the dummy gate structure 490. The high-k dielectric layer 530 conforms to the space left by the dummy gate structure 490 and therefore a thin layer in a shape of U covers up the sidewalls of the gate spacers 442 and 444. A work function metal layer 542 may be formed between the high-k dielectric layer 530 and the gate electrode 540 so as to achieve a desirable electrical property. The gate electrode 540 fills in the remaining space with the high-k dielectric layer underlying, and the gate stack is complete.

Figure 22:
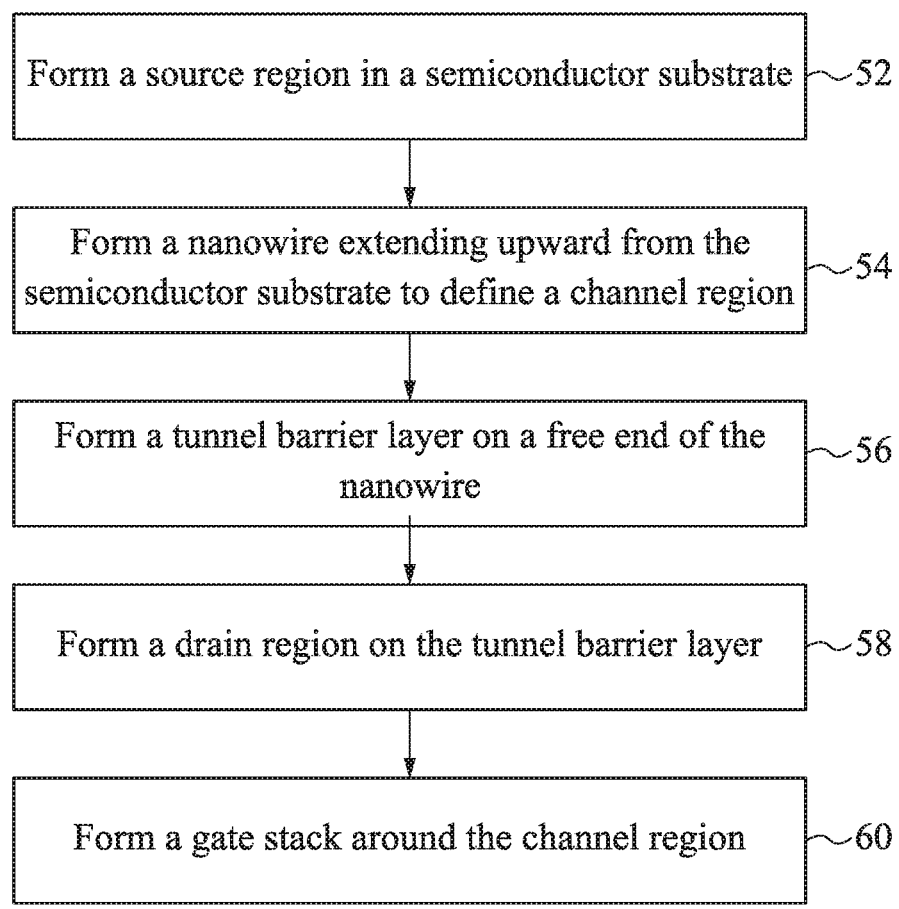
FIG. 22 is a flow chart illustrating a method of fabricating a semiconductor device in accordance with some embodiments of the instant disclosure.

Referring to FIG. 22, a flow chart of a method 50 of fabricating a semiconductor device in accordance with some embodiments of the instant disclosure. The method begins with operation 52 in which a source region is formed in the semiconductor substrate. The method continues with operation 54 in which a nanowire extending upward from the semiconductor substrate is formed to define a channel region. Subsequently, operation 56 is performed. A tunnel barrier layer is formed on a free end of the nanowire. The method continues with operation 58 in which a drain region is formed on the tunnel barrier layer. The method continues with operation 60 in which a gate stack is formed around the channel region. The discussion that follows illustrates embodiments of semiconductor devices that can be fabricated according to the method 50 of FIG. 22.

Figure 23:
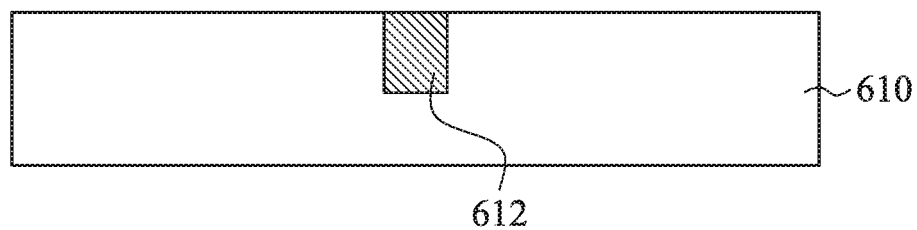
FIGS. 23-32 are cross-sectional views of a portion of a semiconductor device at various stages in a tunnel barrier formation process in accordance with some embodiments of the instant disclosure.

Reference is made to FIG. 23 and operation 52 in FIG. 22. A bottom semiconductor substrate layer 610 is provided. The bottom semiconductor substrate layer 610 may be formed over a base substrate layer (not shown) using an epitaxy process, such as metal-organic (MO) chemical vapor deposition (CVD), molecular beam epitaxy (MBE), liquid phase epitaxy (LPE), vapor phase epitaxy (VPE), selective epitaxial growth (SEG), combinations thereof, and the like. The source region 612 may have a p-type dopant or an n-type dopant depending on the device configuration.

Figure 24:
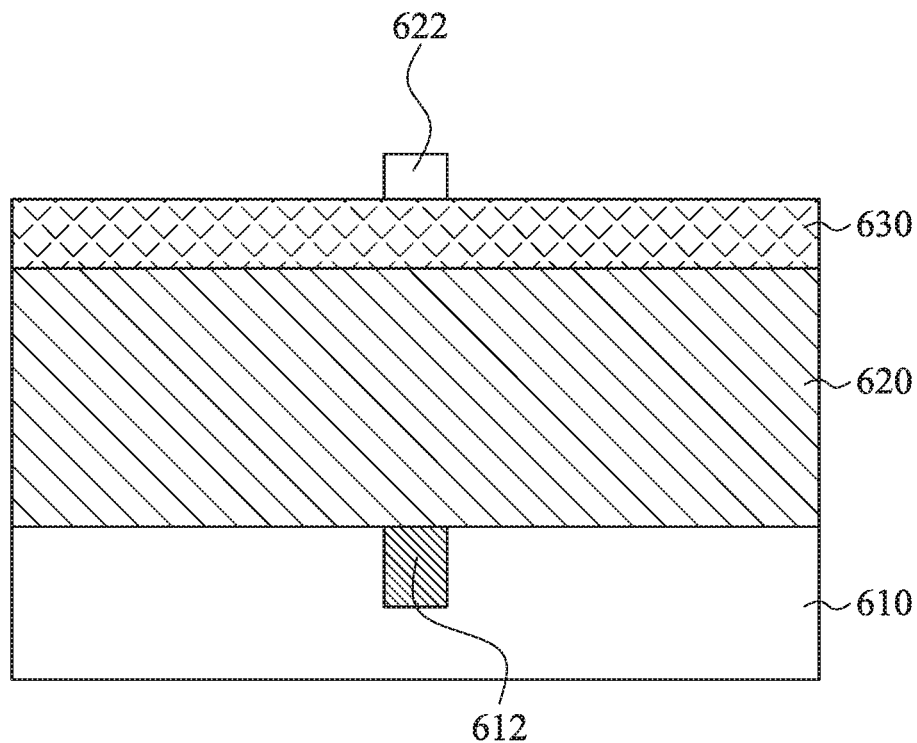

Reference is made to FIG. 24 and operation 54 in FIG. 22. A nanowire layer 620 is formed on the bottom semiconductor substrate 610. In some embodiments, various epitaxies may be performed to form the nanowire layer 620. Any suitable epitaxy processes may be used, such as by MO CVD, MBE, LPE, VPE, SEG, combinations thereof, or the like. The nanowire layer 620 is intrinsic, undoped, layer. A tunnel barrier layer 630 is formed on the nanowire layer 620 by similar processes with a material having larger bandgap. A hard mask 622 is formed on the tunnel barrier layer 630. The position of the hard mask 622 overlaps the source region 612 in the semiconductor substrate 610 such that after patterning, the nanowire 620 is standing on the source region 612. The hard mask 622 may include one or more oxide (e.g., silicon oxide) and/or nitride (e.g., silicon nitride) layers to prevent damage to the underlying tunnel barrier layer 630, nanowire layer 620 and the semiconductor substrate 610 during patterning.

Figure 25:
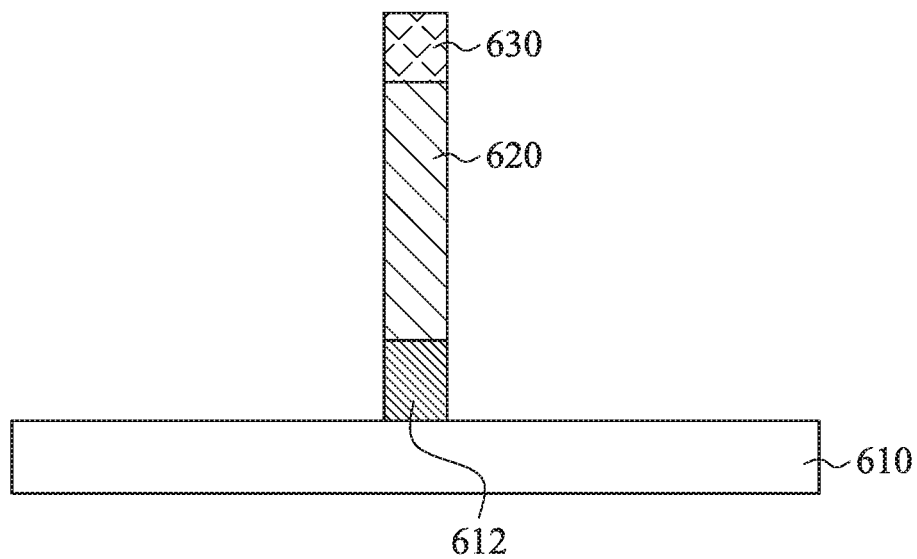

Reference is made to FIG. 25 and operation 54 in FIG. 22. After the patterning process, the nanowire 620 and tunnel barrier layer 630 is formed. Portion of the semiconductor substrate 610 is removed in the patterning process such that the source region 612 becomes a protruded portion on the semiconductor substrate 610 as shown in FIG. 25. A recess is formed on the semiconductor substrate 610, and the recess is where the spacer will be formed in a later stage. The patterning process results in narrow nanowire 620 extending upwardly from the source region 612, having the same cross-sectional area as the source region 612. The nanowire 620 is the channel region in a vertical gate all around (VGAA) configuration.

Figure 26:
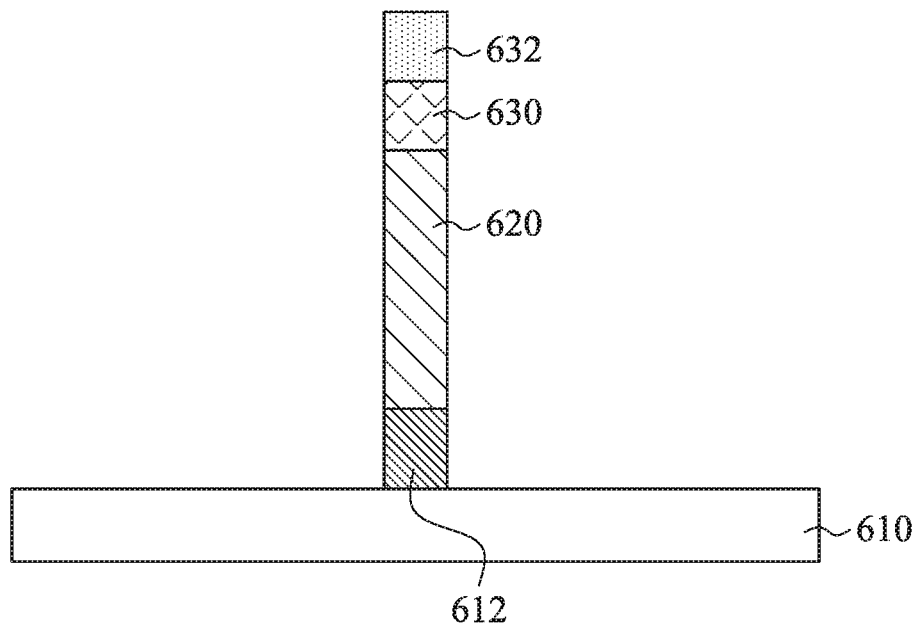

Reference is made to FIG. 26 and operation 58 in FIG. 22. The channel region is sandwiched in between the source region 612 and the tunnel barrier layer 630. The drain region 632 is then formed on the tunnel barrier layer 630. In some embodiments, the drain region 632 is formed by epitaxially growing a semiconductor layer on the semiconductor substrate 610. The semiconductor layer is then patterned according to the dimension of the nanowire 620 (tunnel barrier layer 630). In the case in which the source region 612 is doped with an n-type dopant, the drain region 632 is doped with a p-type dopant. Alternatively, if the source region 612 is doped with a p-type dopant, the drain region 632 is doped with an n-type dopant. The channel region (nanowire 620) remains undoped (intrinsic).

Figure 27:
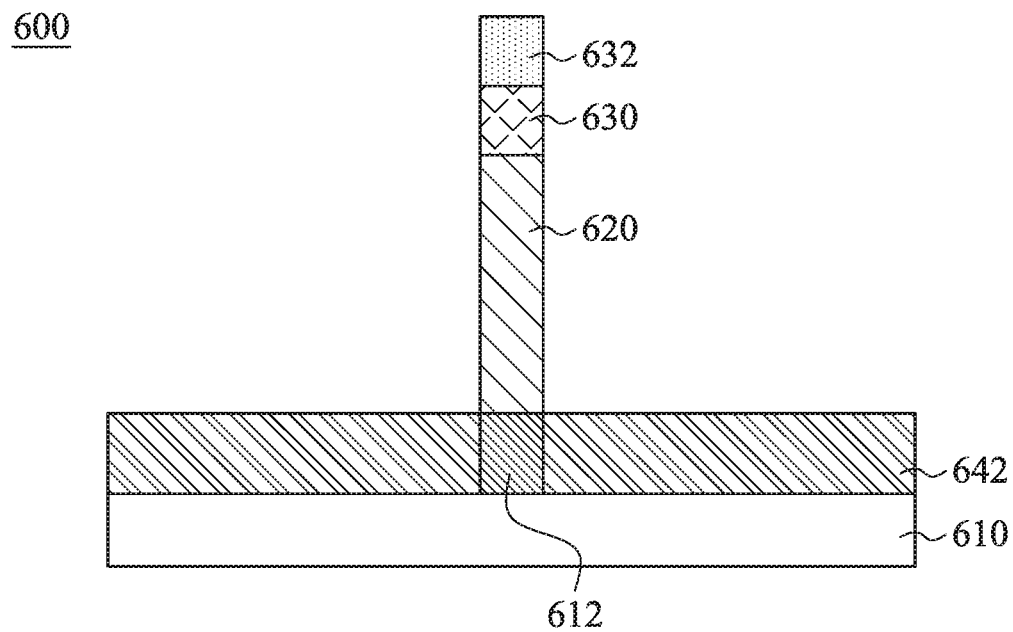

Reference is made to FIG. 27. A first spacer 642 is formed in the recess on the semiconductor substrate 610. The first spacer 642 surrounds the source region 612, blanketing the surface of the semiconductor substrate 610. The nanowire 620 (channel region) is not covered by the first spacer 642.

Figure 28:
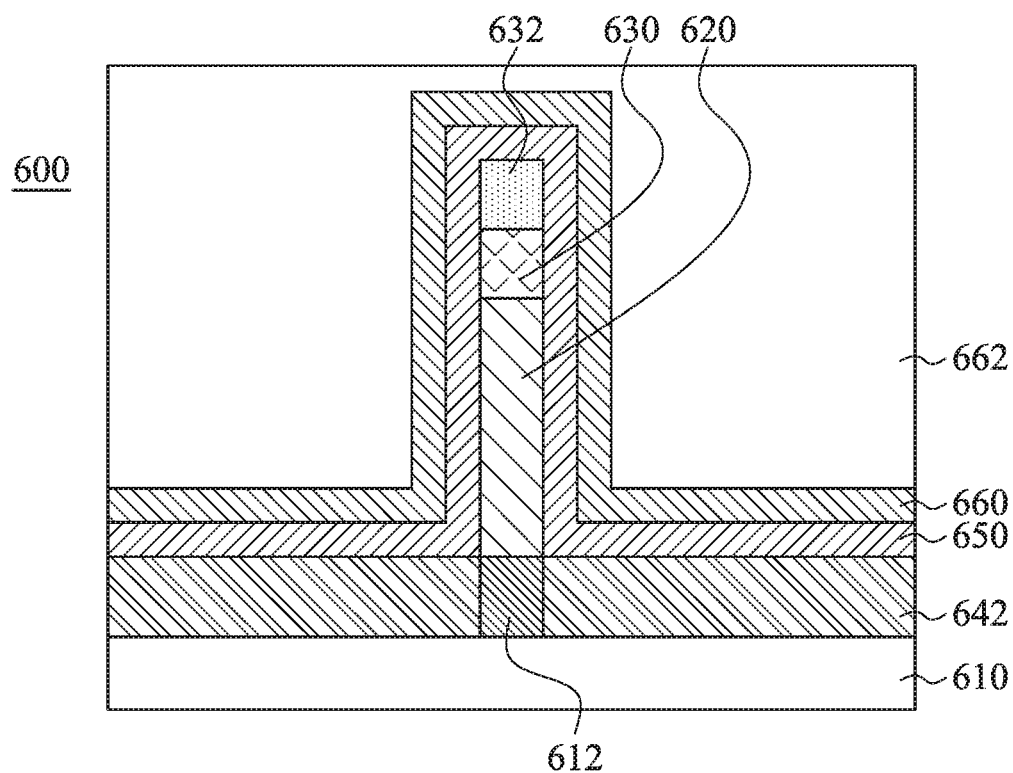
Figure 29:
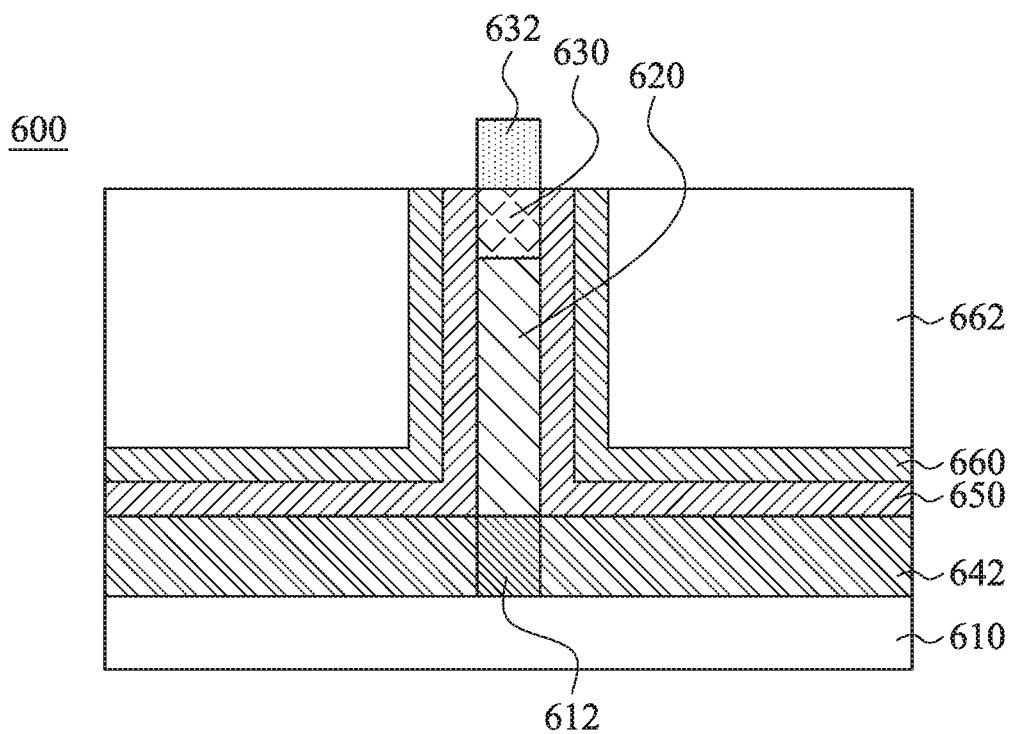

Reference is made to FIG. 28 and operation 60 in FIG. 22. A high-k dielectric layer 650 and a metal layer 660 are conformally formed on the nanowire 620, tunnel barrier layer 630, and drain region 632. The high-k dielectric layer 650 covers the surface of the first spacer 642, climbs along the outer surface of the nanowire 620 and goes over the top surface of the drain region 632. The metal layer 660 follows the same route as the high-k dielectric layer 650 and reproduces the contour of the high-k dielectric layer 650 as shown in FIG. 29. The nanowire 620 is wrapped up in layers by the high-k dielectric layer 650 and the metal layer 660 in succession. After the deposition of the high-k dielectric layer 650 and the metal layer 660, an interlayer dielectric layer 662 is deposited. The interlayer dielectric layer 662 blankets the semiconductor substrate 610 to a thickness that is sufficient to bury the entire nanowire 620 including the tunnel barrier layer 630 and the drain region 632. The source region 612 is free of the high-k dielectric layer 650 and the metal layer 660 because the first spacer 642 occupies the surrounding region of the source region 612.

Figure 30:
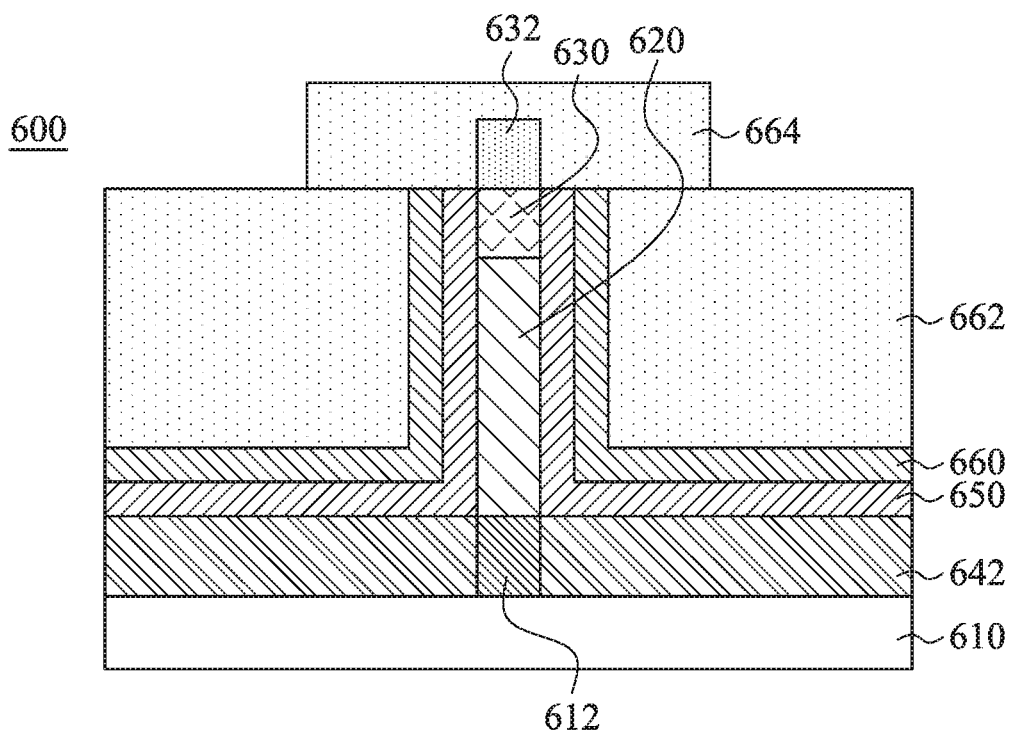

Reference is made to FIG. 29 and operation 60 in FIG. 22. An etching back is performed to remove portions of the interlayer dielectric layer 662, high-k dielectric layer 650, and metal layer 660. As shown in FIG. 30, the drain region 632 is released from the coverage of the high-k dielectric layer 650, metal layer 660 and interlayer dielectric layer 662. The tunnel barrier layer 630 and the nanowire 620 are wrapped around by the high-k dielectric layer 650, metal layer 660 and interlayer dielectric layer 662. The drain region 632 is a bump protruding from the surface of the interlayer dielectric layer 662.

Figure 31:
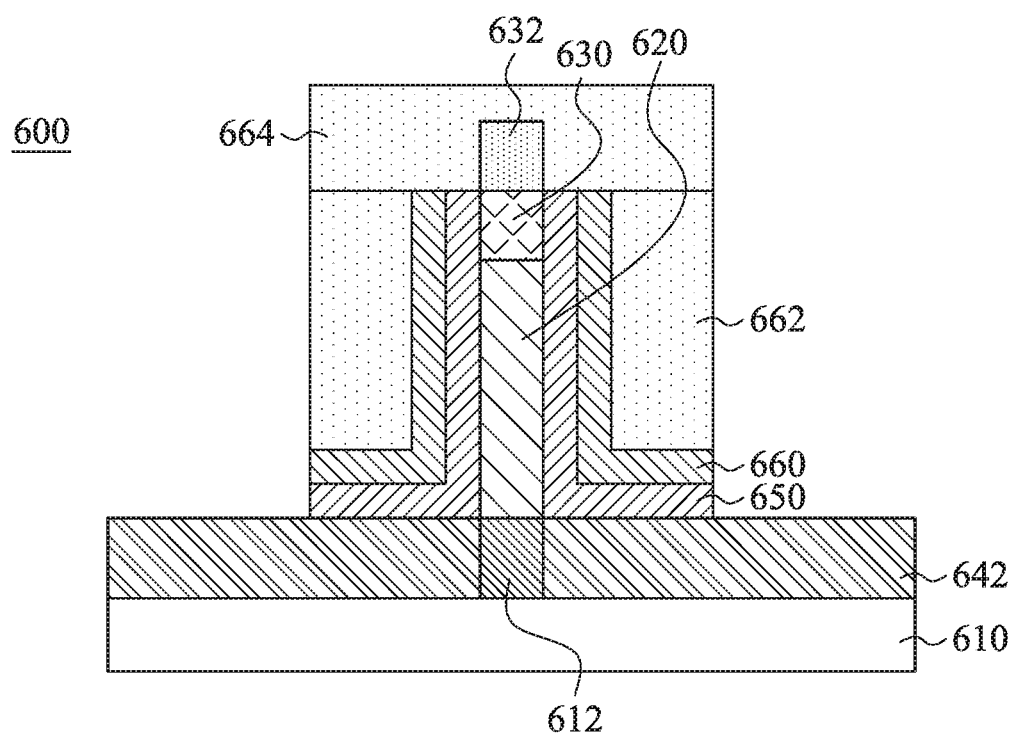

Reference is made to FIG. 30 and operation 60 in FIG. 22. A second spacer 664 is formed around the drain region 632 as the first spacer 642 surrounds the source region 612. The second spacer 664 may be formed by depositing a spacer material on the semiconductor substrate 610 over the interlayer dielectric layer 662. Subsequently, a patterning process is performed to remove excess spacer material, leaving the second spacer 664 as shown in FIG. 31. The drain region 632, high-k dielectric layer 650, the metal layer 660 and a portion of the interlayer dielectric layer 662 are under the coverage of the second spacer 664. The remaining portion of the interlayer dielectric layer 662 is exposed.

Reference is made to FIG. 31 and operation 60 in FIG. 22. The second spacer 664 is used as a mask layer in a patterning process to form the gate stack around the nanowire 620. The interlayer dielectric layer 662 not under the second spacer 664 is removed during the patterning process. The high-k dielectric layer 650 and metal layer 660, which are underlying the exposed interlayer dielectric layer 662, are removed. The first spacer 642 may serve as an etch stop layer in the patterning process, and the top surface of the first spacer 642 is exposed. The drain region 632 is well protected by the second spacer 664 in the patterning process. The components underlying the second spacer 664 are also retained after the patterning process.

Figure 32:
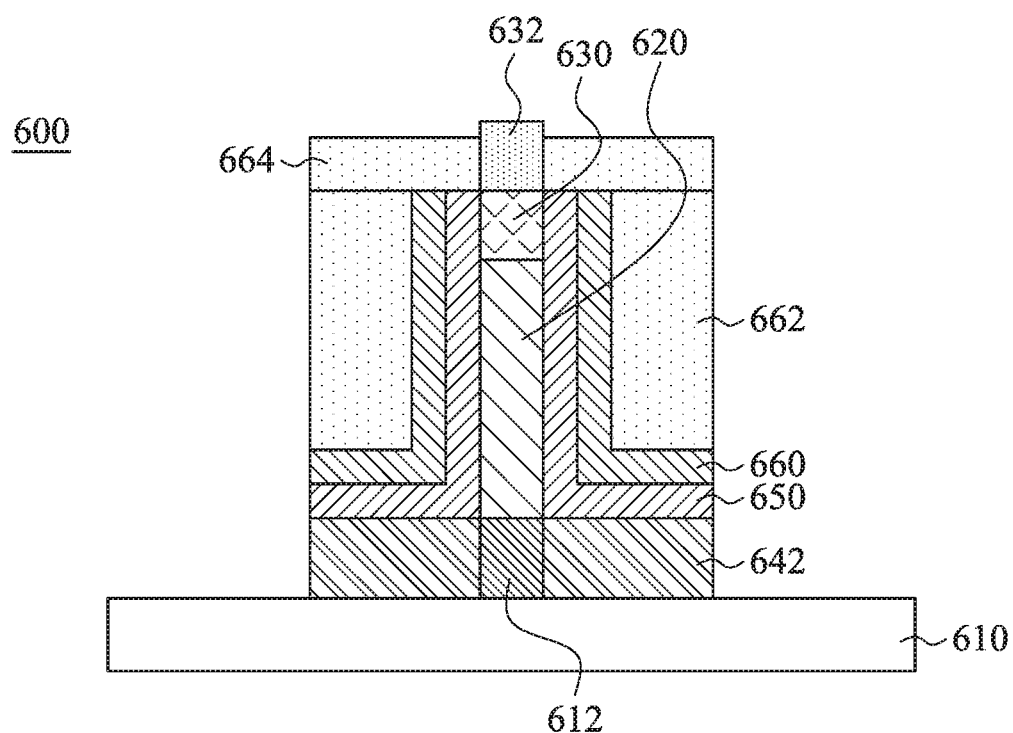

Reference is made to FIG. 32 and operation 60 in FIG. 22. The excess first spacer 642 and second spacer 664 are removed by for example etching, and a VGAA structure having tunnel barrier layer 630 inserted between the channel region (nanowire 620) and drain region 632 is complete. The tunnel barrier layer 630 is completely covered by the gate stack. In some embodiments, the tunnel barrier layer 630 may be covered by the gate stack in different extent. For example, the tunnel barrier layer 630 may be one third covered by the gate stack. In an embodiment, the tunnel barrier layer 630 may be one half covered by the gate stack. The coverage of the gate stack over the tunnel barrier layer has impact on the device performance.

Figure 33:
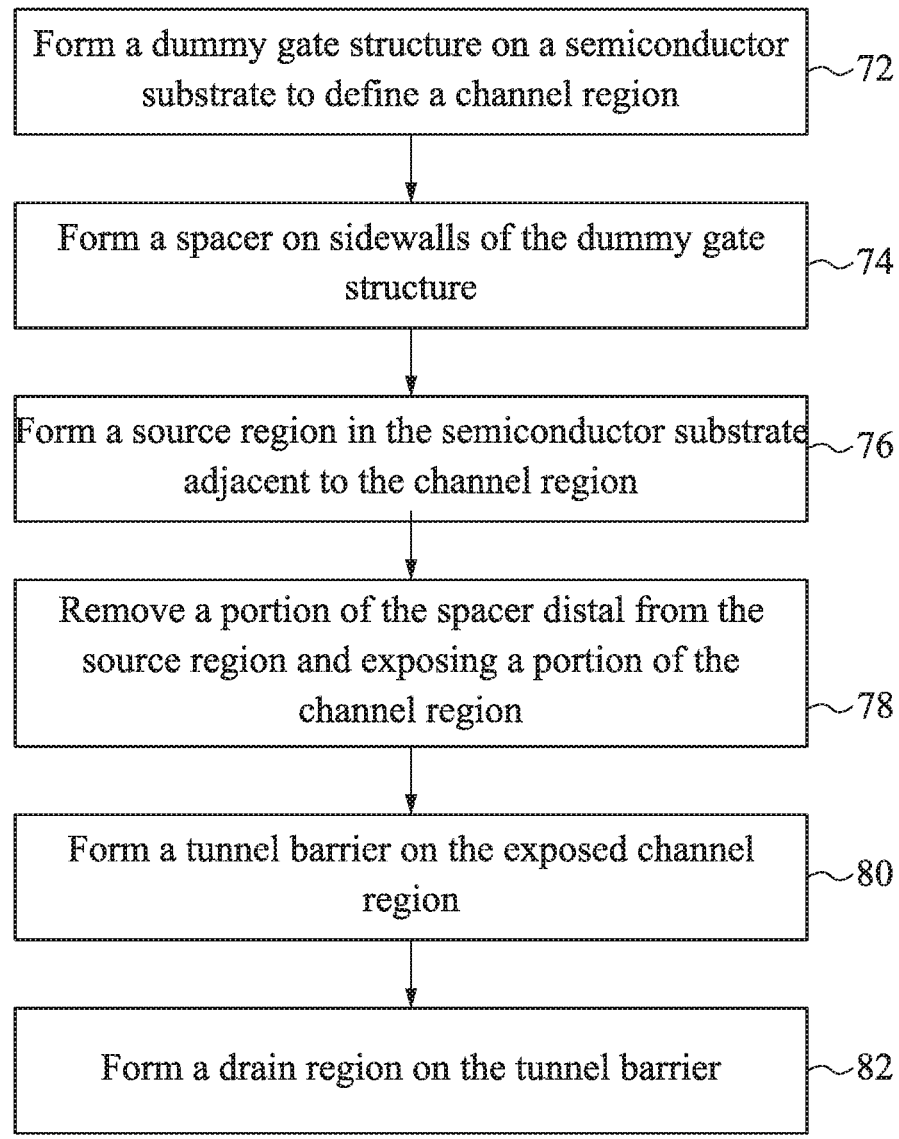
FIG. 33 is a flow chart illustrating a method of fabricating a semiconductor device in accordance with some embodiments of the instant disclosure.

Referring to FIG. 33, a flow chart of a method 70 of fabricating a semiconductor device in accordance with some embodiments of the instant disclosure. The method begins with operation 72 in which a dummy gate structure is formed on a semiconductor substrate to define a channel region. The method continues with operation 74 in which a spacer is formed on sidewalls of the dummy gate structure. Subsequently, operation 76 is performed. A source region is formed in the semiconductor substrate adjacent to the channel region. The method continues with operation 78 in which a portion of the drain side spacer from the source region is removed to expose a portion of the channel region. The method continues with operation 80 in which a tunnel barrier layer is formed on the exposed channel region. The method continues with operation 82 in which a drain region is formed on the tunnel barrier.

Figure 34:
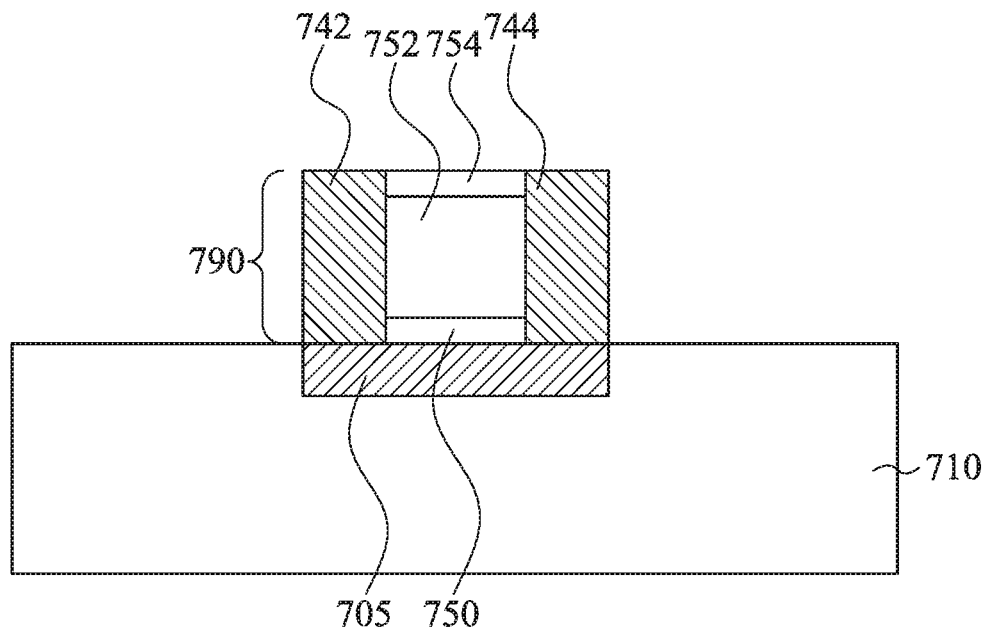
FIGS. 34-41 are cross-sectional views of a portion of a semiconductor device at various stages in a tunnel barrier formation process in accordance with some embodiments of the instant disclosure.

Reference is made to FIG. 34 and operation 72 and 74 in FIG. 34. A gate dielectric layer 750 and a dummy gate layer 752 are formed on the semiconductor substrate 710. A hard mask layer 754 is formed on the dummy gate layer 752 for the subsequent patterning process. The dummy gate layer 752 and the gate dielectric layer 750 undergo a patterning process to form a dummy gate structure 790. The dummy gate structure 790 defines a conductive channel region 705 in the semiconductor substrate 710. The channel region 705 is intrinsic or close to undoped. Gate spacers 742 and 744 are formed around the long sides of dummy gate structure 790. It is understood the gate spacers 742 and 744 are much thicker in comparison with the spacers as previously described because a portion of the gate spacer will be removed in the subsequent process.

Figure 35:
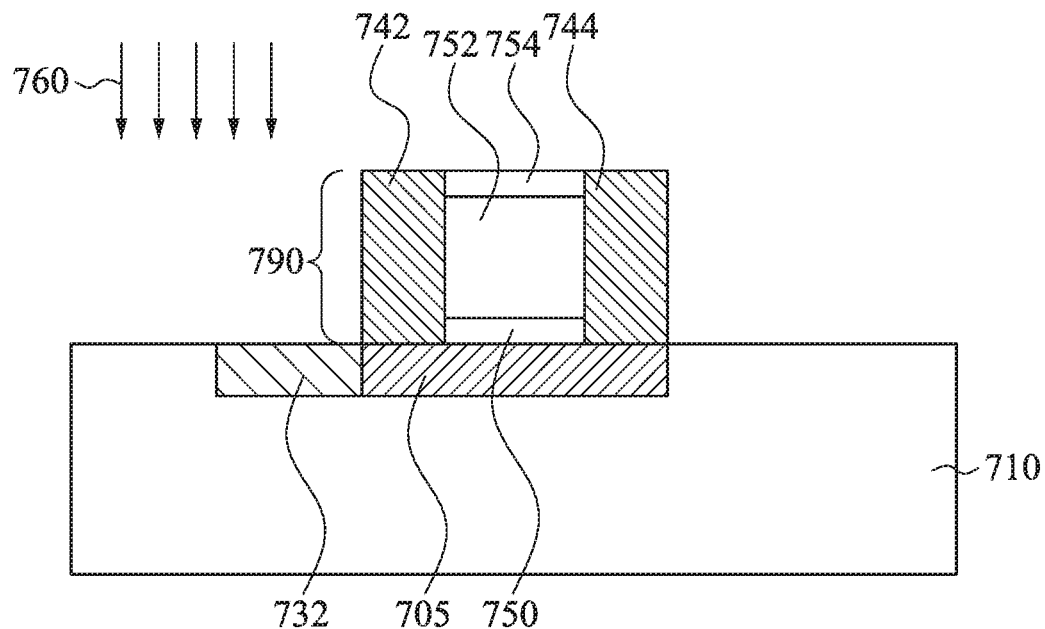

Reference is made to FIG. 35 and operation 76 in FIG. 34. After the spacers 742 and 744 are formed, a first implantation process 760 is performed to implant dopant ions into a portion of the semiconductor substrate 710 adjacent to the channel region 705. A first mask layer 762 may be used in the implantation process such that only the highly doped source region 732 is formed. The dummy gate structure 790 is used as a mask layer over the channel region 705. The source region 732 is highly p doped in case of an n-type TFET, or alternatively in case of a p-type TFET the source region 732 is highly n doped.

Figure 36:
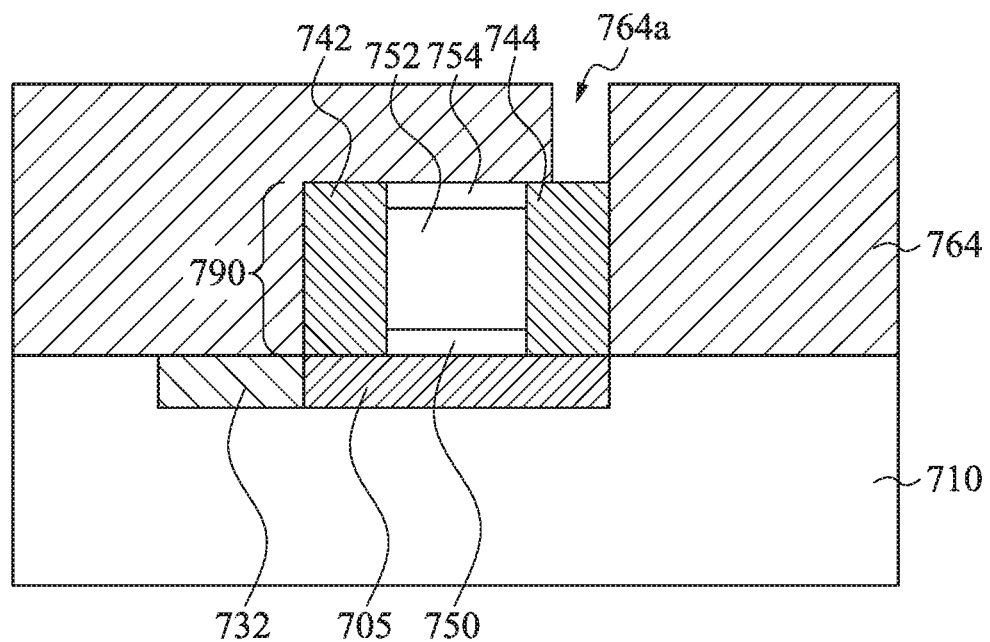

Reference is made to FIG. 36 and operation 78 in FIG. 34. An interlayer dielectric layer 764 is deposited on the semiconductor substrate 710 and over the source region 732 and the dummy gate structure 790. The interlayer dielectric layer 764 is patterned to form an opening 764a. The opening 764a exposes a portion of the gate spacer 744, which is distal from the source region 732. This opening 764a marks the position of which the tunnel barrier layer will be formed. The gate spacer 742, which is proximal to the source region, is under full protection of the interlayer dielectric layer 764.

Figure 37:
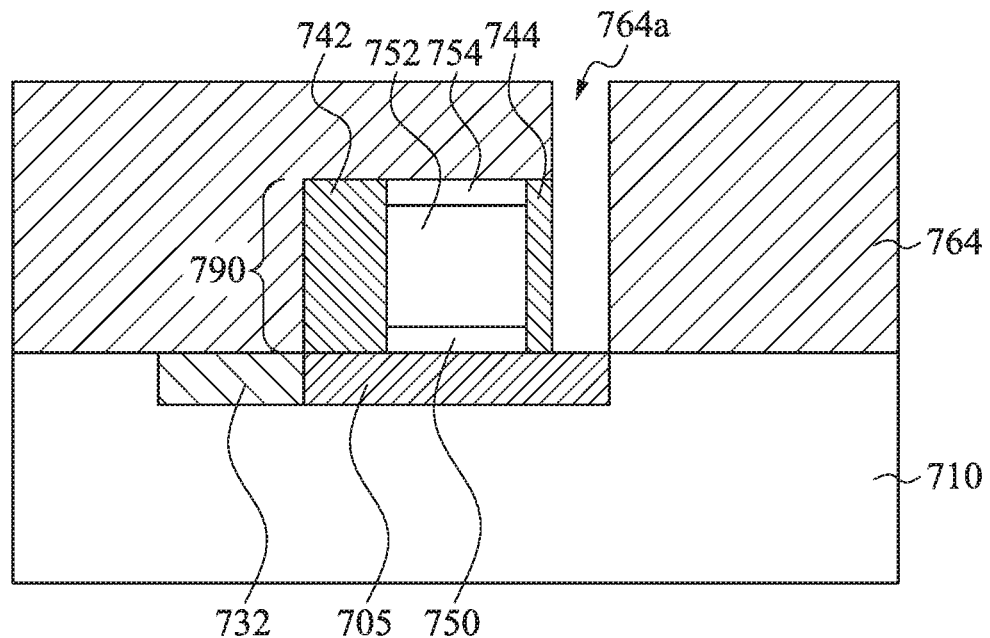

Reference is made to FIG. 37 and operation 78 in FIG. 34. The exposed portion of the gate spacer 744 is removed by for example, etching. After the removal of the exposed portion of the gate spacer 744 the opening 764a is deepened, and the underlying channel region 705 is exposed. Portion of gate spacer 744 still remains on the semiconductor substrate 710. The gate spacer 742 and the gate spacer 744 now have different thickness because the gate spacer 742 is relatively intact under the coverage of the interlayer dielectric layer 764 while the gate spacer 744 is exposed from the opening 764a.

Figure 38:
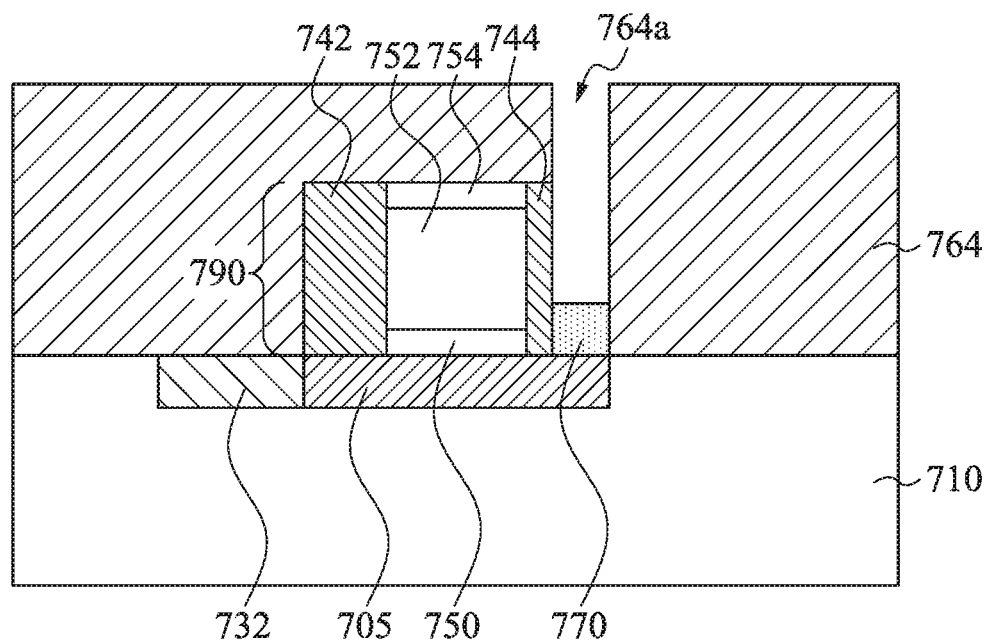

Reference is made to FIG. 38 and operation 80 in FIG. 34. The tunnel barrier layer 770 is epitaxially formed in the opening 764a overlying the channel region 705. The tunnel barrier layer 770 does not occupy the full depth of the opening 764a because the remaining portion is left for the drain region. The tunnel barrier layer 770 may have a thickness of approximately one third of the dummy gate structure 790. The thickness of the tunnel barrier layer 770 does not exceed the height of the dummy gate structure 790. The material of the tunnel barrier layer 770 may have a larger bandgap than the channel region 705.

Figure 39:
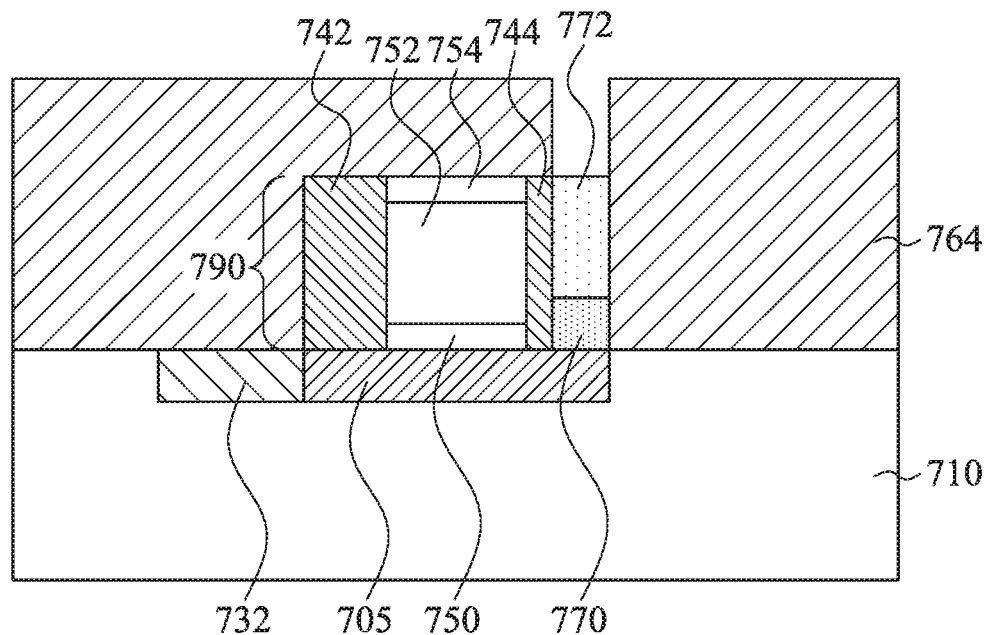

Reference is made to FIG. 39 and operation 82 in FIG. 34. The drain region 772 is epitaxially formed in the opening 764a. The drain region 772 is disposed on the tunnel barrier layer 770. In other words, the drain region 772 superimposes on the channel region 705 but spaced apart by the tunnel barrier layer 770. In addition, the drain region 772 is in a different level from the source region 732. The drain region 772 is not buried in the semiconductor substrate 710 as the source region 732. The drain region 772 is raised to a higher level above the source region 732 such that the source region 732 and the drain region 772 are in a substantially perpendicular arrangement. The source region 732, channel region 705, tunnel barrier layer 770 and drain region 772 altogether form in to a shape of the capital letter "L" with the tunnel barrier layer 770 at the turning corner.

Figure 40:
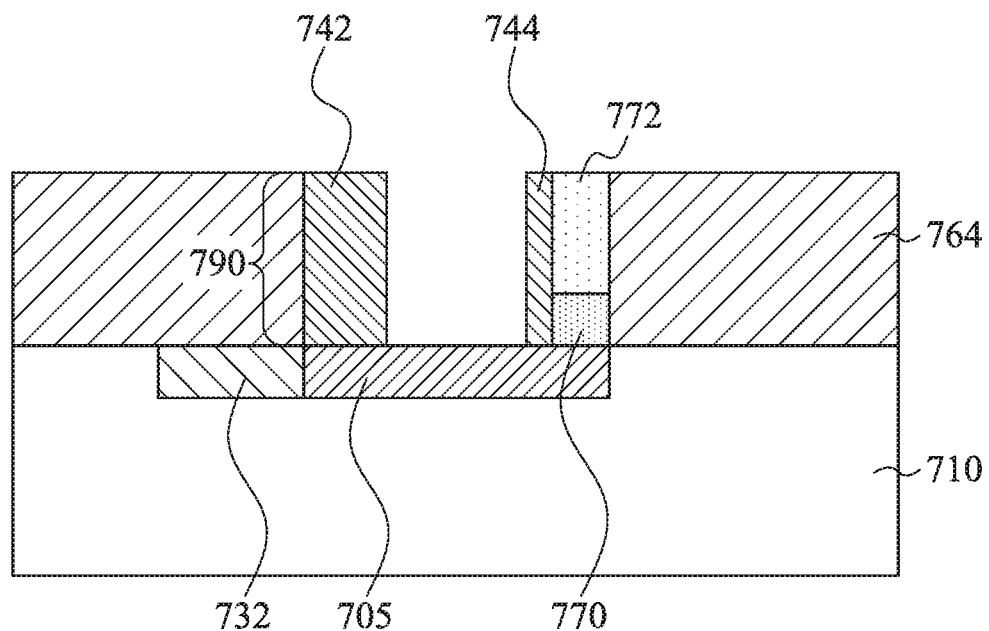

Reference is made to FIG. 40. The interlayer dielectric layer 764 is planarized to remove excess portion, and the dummy gate structure 790 is removed. A space is left after the removal of the dummy gate structure 790 to allow high-k dielectric layer and metal layer to be filling in over the channel region 705.

Figure 41:
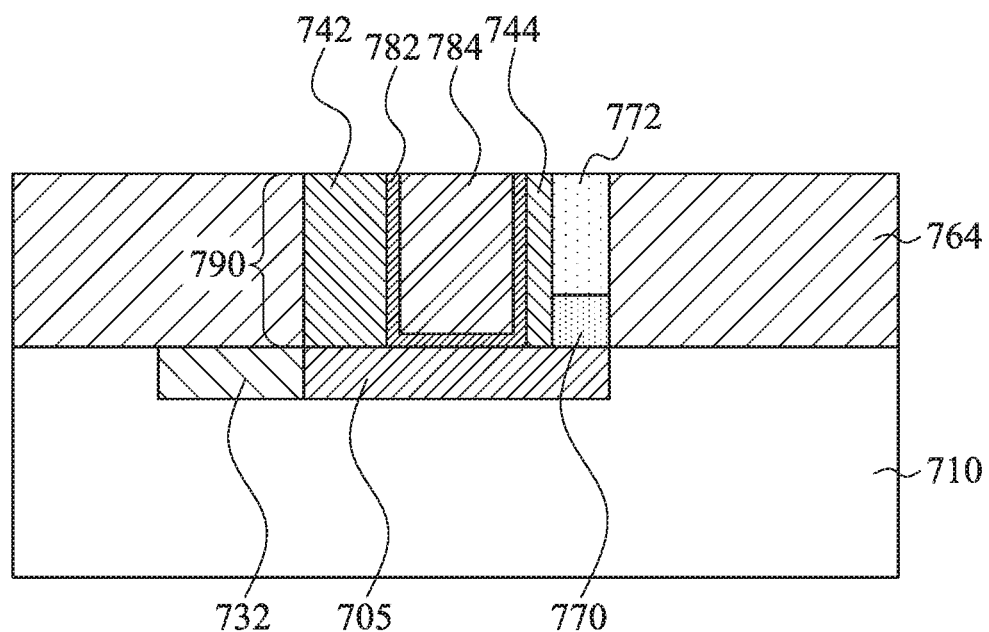

Reference is made to FIG. 41. The gate stack including high-k dielectric layer 782 and a gate electrode 784 is formed in the space left by the dummy gate structure 790. The high-k dielectric layer 782 conforms to the space left by the dummy gate structure 790, and therefore a thin layer in a shape of U covers up the sidewalls of the gate spacers 742 and 744. A work function metal layer (not shown) may be formed between the high-k dielectric layer 782 and the gate electrode 784 so as to achieve a desirable electrical property. The gate electrode 784 fills in the remaining space with the high-k dielectric layer 782 underlying, and the gate stack is complete.

Figure 42:
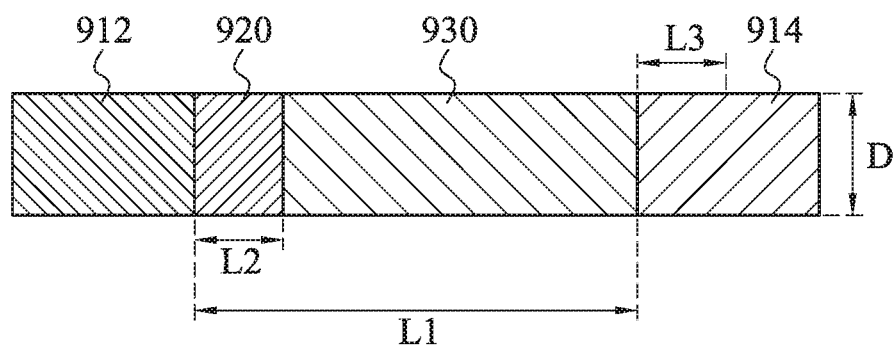
FIG. 42 is a cross-sectional view of a portion of a semiconductor device in accordance with some embodiments of the instant disclosure.

Reference is made to FIG. 42. In some embodiments, a TFET device in the form of nanowire 900 includes a source region 912, a drain region 914, a pocket 920, and a channel region 930. In some embodiments, the source region 912 may include a material of GaSb, the pocket 920, channel region 930 and drain region 914 may include a material of InAs. The channel region 930 is arranged in between the drain region 914 and the pocket 920. The pocket 920 is inserted between the source region 912 and the channel region 930. The channel region 930 has a <111> plane crystalline orientation. When the channel region 930 is arranged at the <111> plane, a significant increase of on-current is observed. The band structure anisotropy is enhanced when the channel region 930 is under <111> plane orientation. More specifically, the on-current can be boosted 50% more in comparison with <100> and <110> plane. The channel region 930 is intrinsic close to undoped. In the case of an n-type TFET, the source region 912 is doped with a p-type dopant at a concentration of approximately $5 \times 10^{19}$ cm$^{-3}$, while the drain region 914 is doped with an n-type dopant at a concentration of approximately $2 \times 10^{18}$ to $4 \times 10^{18}$ cm$^{-3}$. In the case of p-type TFET, the source region 912 is doped with an n-type dopant at a concentration of approximately $5 \times 10^{18}$ to $2 \times 10^{19}$ cm$^{-3}$, while the drain region 914 is doped with a p-type dopant at a concentration of approximately $6 \times 10^{18}$ to $9 \times 10^{18}$ cm$^{-3}$. The dopant concentration in the drain region 914 is not uniform. A lowly doped drain region 914a is in between the channel region 930 and the drain region 914. The lowly doped drain region 914a has a much lower dopant concentration than the remaining drain region 914a. The lowly doped drain region 914a may have a dopant concentration close to undoped. The pocket 920 has a dopant concentration of approximately $5 \times 10^{19}$ cm$^{-3}$. In the case of an n-type TFET, the pocket 920 is doped with n-type dopant, which is opposite to the p-type dopant in the source region 912. Alternatively, in the case of a p-type TFET, the pocket 920 is doped with p-type dopant, which is opposite to the n-type dopant in the source region 912. The pocket 920 promotes tunnelling through, for example, high dopant concentration and/or lower effective mass material and lower effective bandgap in comparison with the source region 912.

Reference is still made to FIG. 42. A gate length $L_1$, which includes the pocket 920 and the channel region 930, is measured of approximately 18-25 nm. The pocket 920, which bears opposite type of dopant from the source region 912, has a length $L_2$ of approximately 4 nm. The lowly doped drain region 914a has a length $L_3$ of approximately 10 nm. The nanowire 900 has a diameter D of approximately 5 to 6 nm. Due to quantum confinement, III-V effective mass (EM), density of state (DoS) and bandgap (BG) increase when decreasing D, this configuration benefits from best trade-off between subthreshold swing (SS) and transmission probability in the on-state (on-current).

The insertion of the tunnel barrier layer between the channel region and the drain region of the TFET creates an additional confinement in the transport direction. The level of ambipolar current and source to drain tunnelling is significantly reduced. By adjusting the parameters of tunnel barrier layer dimension, material, doping levels, and positioning, the energy filtering, ambipolar current and source to drain tunnelling can be finely controlled. The on- to off-current ratio can greatly benefit from the presence of the tunnel barrier layer.

In some embodiments, a semiconductor device includes a source region having a first dopant and a drain region having a second dopant. The first dopant is different from the second dopant. A channel region is in between the source and drain region. The channel region is intrinsic. A tunnel barrier layer disposed in between the drain region and the channel region. A gate stack disposed on the channel region.

In some embodiments, a semiconductor device includes a source region having a first dopant and a drain region having a second dopant. The first dopant is different from the second dopant. A channel region is between the source and drain regions. The channel region extending along <111> plane. The channel region includes InAs. A tunnel barrier layer is in between the source region and the channel region. A gate stack is disposed around the channel region and the tunnel barrier layer.

In some embodiments, a method of fabricating a semiconductor device includes forming a channel region on a semiconductor substrate. A tunnel barrier layer is formed next to the channel region. Source and drain regions are formed on the semiconductor substrate. The tunnel barrier layer is between the channel region and drain region. A material of the tunnel barrier layer has a larger bandgap than the channel region. A gate stack is formed on the channel region.

According to some embodiments of the present disclosure, a method for fabricating a semiconductor device includes forming a channel region in a semiconductor substrate. The channel region is made of a first material. The method also includes forming source and drain regions in the semiconductor substrate. The method further includes forming a recess between the channel region and the drain region. The method further includes forming a tunnel barrier layer in the recess. The tunnel barrier layer is made of a second material, and a bandgap of the second material is greater than a bandgap of the first material. The method further includes forming a gate stack on the channel region.

According to some embodiments of the present disclosure, a method for fabricating a semiconductor device includes forming a dummy gate structure on a semiconductor substrate to define a channel region. The channel region is made of a first group III-V material. The method also includes forming a first spacer and a second spacer over opposite sidewalls of the dummy gate structure. The method further includes forming a source region in the semiconductor substrate adjacent to the channel region. The method further includes removing a portion of the second spacer to expose a portion of the channel region. The method further includes forming a tunnel barrier layer over the exposed portion of the channel region. The method further includes forming a-drain region on the tunnel barrier layer. The tunnel barrier layer is made of a second group III-V material, and a bandgap of the second group III-V material is greater than a bandgap of the first group III-V material of the channel region.

According to some embodiments of the present disclosure, a method for fabricating a semiconductor device includes forming a source region in a semiconductor substrate. The method also includes forming a channel region extending upward from the semiconductor substrate. The channel region is intrinsic and the channel region is made of a first material. The method further includes forming a tunnel barrier layer over the channel region. The tunnel barrier layer is made of a second material, and a bandgap of the second material is greater than a bandgap of the first material of the channel region. The method further includes forming a drain region on the tunnel barrier layer. The method further includes forming a gate stack around the channel region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, the method comprising:
   forming a source region in a semiconductor substrate;
   forming a channel region extending upward from the semiconductor substrate, wherein the channel region is intrinsic and the channel region is made of a first material;
   forming a tunnel barrier layer over the channel region, wherein the tunnel barrier layer is made of a second material, and a bandgap of the second material is greater than a bandgap of the first material of the channel region;
   forming a drain region on the tunnel barrier layer; and
   forming a gate stack around the channel region, wherein forming the gate stack comprises conformally forming a high-k dielectric layer and a metal layer around the channel region, the tunnel barrier layer, and the drain region; and etching back the high-k dielectric layer and the metal layer until the drain region is exposed.

2. The method of fabricating a semiconductor device as claimed in claim 1, further comprising:
   forming a first spacer surrounding the source region and blanketing a top surface of the semiconductor substrate.

3. The method of fabricating a semiconductor device as claimed in claim 2, wherein the high-k dielectric layer is formed over a top surface of the first spacer.

4. The method of fabricating a semiconductor device as claimed in claim 1, further comprising:
   forming a second spacer surrounding the drain region covering an interlayer dielectric layer over the semiconductor substrate.

5. The method of fabricating a semiconductor device as claimed in claim 4, wherein the second spacer covers a top surface of the gate stack.

6. The method of fabricating a semiconductor device as claimed in claim 4, further comprising:
   removing a portion of the second spacer until a top surface of the drain region is exposed.

7. The method of fabricating a semiconductor device as claimed in claim 4, further comprising:
   patterning the high-k dielectric layer such that sidewalls of a bottom portion of the high-k dielectric layer is aligned with sidewalls of the second spacer.

8. The method of fabricating a semiconductor device as claimed in claim 7, further comprising:
   patterning the first spacer such that the sidewalls of the bottom portion of the high-k dielectric layer is aligned with sidewalls of the first spacer.

9. The method of fabricating a semiconductor device as claimed in claim 1, wherein a top surface of the high-k dielectric layer is level with a bottom surface of the drain region after etching back the high-k dielectric layer.

10. A method of fabricating a semiconductor device, the method comprising:
    forming a source region in a semiconductor substrate;
    forming a nanowire extending upward from the semiconductor substrate to define a channel region;
    forming a tunnel barrier layer over an end of the nanowire;
    forming a drain region over the tunnel barrier layer; and
    forming a gate stack around the channel region;
    wherein the method further comprises:
        blanketly depositing a nanowire layer and the tunnel barrier layer over the semiconductor substrate; and
        patterning the nanowire layer, the tunnel barrier layer, and the semiconductor substrate to expose sidewalls of the source region,
    wherein the nanowire and the tunnel barrier layer are made of different materials, and a bandgap of the tunnel barrier layer is greater than a bandgap of the nanowire, and
    wherein the channel region is intrinsic.

11. The method of fabricating a semiconductor device as claimed in claim 10, wherein forming the drain region comprises:
    epitaxially growing a semiconductor layer over the semiconductor substrate; and
    patterning the semiconductor layer until a width of the semiconductor layer and a width of the nanowire are the same.

12. The method of fabricating a semiconductor device as claimed in claim 10, further comprising:
    depositing an interlayer dielectric layer burying the nanowire, the tunnel barrier layer, and the drain region.

13. The method of fabricating a semiconductor device as claimed in claim 10, further comprising:
    removing a portion of the interlayer dielectric layer to expose sidewalls and a top surface of the drain region.

14. The method of fabricating a semiconductor device as claimed in claim 13, wherein a top surface of the interlayer dielectric layer is level with a bottom surface of the drain region after removing the portion of the interlayer dielectric layer.

15. The method of fabricating a semiconductor device as claimed in claim 10, wherein a top surface of the substrate is level with a bottom surface of the source region after patterning the substrate.

16. The method of fabricating a semiconductor device as claimed in claim 10, further comprising:
   forming a hard mask layer over the channel barrier layer, wherein the hard mask layer overlaps the source region in a top view.

17. A method of fabricating a semiconductor device, the method comprising:
   forming a source region over a semiconductor substrate;
   forming a nanowire over the source region;
   forming a channel barrier layer over the nanowire;
   forming a drain region over the channel barrier layer; and
   forming a gate stack around the nanowire,
   wherein the nanowire and the channel barrier layer are made of different materials, and a bandgap of the nanowire and a bandgap of the channel barrier layer are different,
   wherein the bandgap of the channel barrier layer is greater than the bandgap of the nanowire,
   wherein the source region and the drain region are doped with different type, and
   wherein the method further comprises
      forming a first spacer covering a top surface of the gate stack and the drain region; and
      patterning the first spacer such that sidewalls of the first spacer are aligned with sidewalls of the gate stack.

18. The method of fabricating a semiconductor device as claimed in claim 17, further comprising:
   patterning the source region, the nanowire, the channel barrier layer, and the drain region such that sidewalls of the source region, the nanowire, the channel barrier layer, and the drain region are aligned.

19. The method of fabricating a semiconductor device as claimed in claim 17, further comprising: forming a second spacer over the substrate before forming the gate stack; patterning the second spacer such that sidewalls of the second spacer are aligned with sidewalls of the first spacer.

20. The method of fabricating a semiconductor device as claimed in claim 17, further comprising:
   recessing the first spacer until a top surface and a portion of sidewalls of the drain region are exposed.

* * * * *